United States Patent
Pierret et al.

(10) Patent No.: US 7,224,145 B2
(45) Date of Patent: May 29, 2007

(54) CONTROL AND POWER MODULE FOR INTEGRATED ALTERNATOR-STARTER

(75) Inventors: Jean-Marie Pierret, Paris (FR); Jean Julien Pfiffer, Montgeron (FR); Fabrice Tauvron, Athis-Mons (FR)

(73) Assignee: Valeo Equipments Electriques Moteur, Creteil (FR)

( * ) Notice: Subject to any disclaimer, the term of this patent is extended or adjusted under 35 U.S.C. 154(b) by 343 days.

(21) Appl. No.: 10/519,081

(22) PCT Filed: Jul. 4, 2003

(86) PCT No.: PCT/FR03/02092

§ 371 (c)(1),
(2), (4) Date: Dec. 23, 2004

(87) PCT Pub. No.: WO2004/006423

PCT Pub. Date: Jan. 15, 2004

(65) Prior Publication Data

US 2005/0253457 A1 Nov. 17, 2005

(30) Foreign Application Priority Data

Jul. 4, 2002 (FR) .................................. 02 08420
Jun. 18, 2003 (FR) .................................. 03 07378

(51) Int. Cl.
*H02P 9/00* (2006.01)
(52) U.S. Cl. ........................ 322/25; 322/28; 323/282
(58) Field of Classification Search .................. 322/22, 322/23, 24, 25, 27, 28, 99; 323/282, 305; 363/71
See application file for complete search history.

(56) References Cited

U.S. PATENT DOCUMENTS

| | | | | |
|---|---|---|---|---|
| 5,020,491 A | * | 6/1991 | Mashino | 123/192.1 |
| 5,552,976 A | * | 9/1996 | Munro et al. | 363/39 |
| 5,561,363 A | * | 10/1996 | Mashino et al. | 322/25 |
| 5,569,966 A | * | 10/1996 | Schantz et al. | 307/10.1 |
| 5,581,171 A | * | 12/1996 | Kerfoot et al. | 320/137 |
| 5,705,909 A | * | 1/1998 | Rajashekara | 318/801 |
| 6,154,383 A | * | 11/2000 | Cardwell, Jr. | 363/71 |
| 6,310,468 B1 | * | 10/2001 | Feldtkeller | 323/282 |

FOREIGN PATENT DOCUMENTS

| | | |
|---|---|---|
| EP | 0 357 183 | 3/1990 |
| EP | 0 660 501 A1 | 6/1995 |
| EP | 1 134 886 A1 | 9/2001 |

* cited by examiner

*Primary Examiner*—Nicholas Ponomarenko
(74) *Attorney, Agent, or Firm*—Berenato, White & Stavish

(57) ABSTRACT

The invention relates to a control and power module for an alternator-starter for a motor vehicle, connected between the alternator-starter (3), an on-board wiring network (Ua) and a ground line (GND) of the vehicle, and comprising:
  a transistor bridge with several branches (B1–B3), and
  a control unit for comparing a phase voltage ($\psi$) of the machine with a reference voltage (Ua, GND) and for controlling the transistors as a function of the result of the comparison,
the control unit comprising:
  a driver (10, 20, 30) for each branch of the transistor bridge, the driver being connected close to the transistors of the branch, and
  a control circuit for controlling the drivers.

18 Claims, 17 Drawing Sheets

CONTROL AND POWER MODULE FOR INTEGRATED ALTERNATOR-STARTER

FIELD OF THE INVENTION

This invention relates to a rotary reversible electrical machine, such as an alternator-starter, which is adapted in particular, firstly to supply with electricity the on-board wiring network of a motor vehicle and to charge the battery of that vehicle, and secondly, to start the engine of the motor vehicle. More particularly, the invention relates to a control and power module adapted to control such a machine.

STATE OF THE ART

In a motor vehicle, the alternator converts rotary movement of the inductive rotor, driven by the engine of the vehicle, into an induced electric current in the windings of the stator. The alternator can also be reversible, and so constitute an electric motor, or rotary electric machine, which is arranged to drive the engine of the vehicle in rotation via the rotor shaft. This reversible alternator is called an alternator-starter, or starter-alternator. It enables mechanical energy to be converted into electrical energy and vice versa. Thus an alternator-starter can start the engine of the motor vehicle, or again it can work in a motor mode to drive the vehicle itself. In general, the stator has three windings, such that the alternator is of the three-phase type. In another version, the alternator is of the six-phase type and can be wound with conductor bars of hairpin form. When the machine is working in starter mode or when it is working in motor mode, it has to transmit a very high torque to the engine.

This machine, being of the polyphase and reversible type, therefore works as an alternator, in particular for the purpose of charging the battery of the vehicle and, in starter mode, for driving the internal combustion engine of the vehicle, also referred to as its heat engine, in order to start the latter.

For this purpose, a power unit connected on the phases of the armature of the alternator serves as a control bridge for the said phases in the motor mode, and acts as a rectifier bridge when the alternator-starter is working in alternator mode.

FIG. 20 shows a rotary electrical machine, in the form of an alternator-starter in the prior art, such as is described in the document WO01/69762.

In FIG. 20, the right hand part corresponds to the front of the machine and the left hand part corresponds to the rear of the machine. This rotary machine, which is an alternator, comprises:
- a wound rotor 743 constituting the inductor which is conventionally associated with two collecting rings 706 and 707, together with two brushes through which the excitation current is taken;
- a polyphase stator 503 carrying several coils or windings, and constituting the armature 507, which are connected either in star configuration or in delta configuration in the most frequent case of a three-phase structure, and which deliver the converted electric power to the rectifier bridge in the alternator mode.

The bridge is connected to the various phases of the armature, and is mounted between earth and a power output terminal of the battery. This bridge has for example diodes associated with MOSFET type transistors.

An alternator of this kind operates in the motor mode by imposing, for example, a direct current in the inductor and by delivering synchronously, on the phases of the stator, signals which are dephased by 120° and which are ideally sinusoidal but which may be trapezoidal or square waves.

The said bridge, as a rectifier in the alternator mode and as a control bridge in the motor mode, is governed by a control unit. The power unit, consisting of the rectifier and control bridge and the control unit together, constitutes a control and power module which is fitted on the outside of the rotary electrical machine, to which it is connected by means of an electrical connection to the output terminals of the phases of the stator.

Means are also arranged for the following of the angular position of the rotor, so that, in the electric motor mode, the electric current is injected at the correct instant into the appropriate winding of the stator.

The said means, which are preferably of a magnetic type, transmit information to the control unit, and are described for example in the documents FR 2 807 231 and FR 2 806 223.

These means accordingly comprise a target member 750 which is mounted for rotation on the rotor or the pulley 701 of the machine, together with at least one sensor 752 of the Hall Effect type or magneto-resistive type, for detecting the movement of the target member, the latter being preferably of the magnetic type.

Preferably at least three sensors 752 are provided, these being carried by the front bearing plate 713 or the rear bearing plate 504 of the rotary electrical machine, whereby to support the stator fixedly and the rotor for rotation of the latter.

The sensor carrier 753, which in this example is of plastics material, has axially oriented portions 755. These portions 755 extend through the bearing plate 504, in this example via a hole 754. The sensors 752 are fixed with respect to the portions 755, and are fitted radially between the target member 750 and the blades 504, being very close to the target member 750. The sensor carrier is mounted on a fastening bolt 757.

The electrical connections of the sensor 752 are mounted in the sensor carriers 753, which have two ear portions 756 by which they are secured on the base of the rear bearing plate 504 on the side opposite to the target member 750 and rotor 743.

The brush carrier 716 is fixed on the same face of the base of the rear bearing plate 504, by means of bolts and ear portions which are not given reference numerals.

The brush carrier 716 carries, in the known way, two cages for guiding brushes, each co-operating with one of the slip rings 706 and 707 carried on the rear end of the shaft 502. The brushes are acted on by springs fitted in the cages.

In certain cases it is desired to improve the starting performance of an alternator-starter. It is thus possible to super-excite the rotor in order to obtain a higher starting torque.

This super-excitation may be obtained by applying a voltage across the excitation winding, and/or a current in the excitation winding, which in both cases is greater than that in a conventional alternator.

This may be achieved with the aid of an electronic voltage booster for super-exciting the rotor winding only in the starter mode.

In this example the machine has the structure of a conventional alternator, for example it is of the same type as that described in the document EP-A-0 515 259, to which reference should be made for more details.

The pole wheels 741 and 742 are formed with holes for force-fitting of the shaft 502 therein. More precisely, the shaft 502 is harder than the pole wheels 741 and 742, for fastening the latter by their knurled portions.

The shaft 502 extends on either side of the rotor 743, and forms a sub-assembly with the latter.

Each pole wheel carries a fan 515 having the blades 505 and fixed, in this example by electric welding, to the radial plate portion of the pole wheel.

The machine is accordingly provided with internal ventilation (air cooling), with its rotor carrying a fan 515 at least at one of its axial ends. In another version, the machine is water cooled.

More precisely, the rotor is a rotor having claws 743 with pole wheels 741 and 742 which carry at their outer periphery axially oriented trapezoidal teeth. The teeth of one pole wheel are directed towards the teeth of the other pole wheel, the said generally trapezoidal teeth being spaced apart in such a way that they are interleaved as between one pole wheel and the other.

As described for example in the document FR-A-2 793 085, permanent magnets can of course be interposed between the teeth of the pole wheels in order to increase the magnetic field.

The rotor carries an excitation winding between the radial plate portions of its pole wheels. This winding comprises an electrically conductive element which is wound so as to form turns. This winding is an excitation winding which, when active, magnetises the rotor so as with the aid of the teeth to set up magnetic poles. The ends of the rotor winding are each connected to a slip ring on which a brush is in rubbing contact. The brushes are carried by a brush carrier which is fixed to the rear bearing plate of the machine, which carries a central ball bearing that supports the rear end of the shaft for rotation of the latter, the rotor being fixed to and carried by the shaft.

The front end of the shaft is carried for rotation by a ball bearing 711 carried by the front bearing plate 713 of the machine. The front end of the shaft carries on the outside of the machine a pulley 701 which is part of a motion transmission device that includes at least one drive belt in engagement with the pulley. The motion transmitting device establishes a coupling between the pulley and a member, such as another pulley, which is driven in rotation by the internal combustion engine of the vehicle.

In addition, a rear cap 511 is mounted on the rear bearing plate 504, in particular to protect the brush carrier, so that the said follower means are properly protected and easier to fit.

When the machine—an alternator-starter in this example—is working in alternator mode, that is to say as an electrical generator, the pulley 701 is driven in rotation by the internal combustion engine of the vehicle through at least the above mentioned drive belt. When the machine is working in starter mode, that is to say as an electric motor, the pulley drives the engine of the vehicle in rotation via the drive belt.

The front and rear bearing plates, which are perforated for the purposes of internal ventilation of the machine, are joined together, for example by means of stretchers 527, and are part of the support for the machine adapted to be fixed on a fixed part of the vehicle. This support carries the stator, fixed at its outer periphery, and usually consisting of a stack of laminations 508 formed with slots for mounting of the coils, or more generally the windings, of the stator, their outputs being connected to the above mentioned rectifier and control bridge.

The coils or windings of the stator are formed from wires or bar windings in the manner described for example in the document WO02/06527; the bars may be of rectangular cross section.

The stator surrounds the rotor, the brushes of which are connected to a regulator of the alternator in order to maintain the alternator voltage at a desired value, which in this example is for example of the order of 14V for a battery of 12V.

The control and power module and the regulator in this example are mounted in an electronic unit which is fitted on the outside of the rotary electrical machine. The regulator may also be incorporated in the control unit of the control and power, module which is mounted on the outside. The said casing carries switching means, consisting of power interrupters, a control unit and a super-excitation circuit. The super-excitation circuit is active in the starter mode in order to maximise the starting torque from the alternator-starter, and to start the internal combustion engine, also called the heat engine, of the motor vehicle more easily, either during cold starting or during re-starting after, for example, a stop or a red traffic light, the engine having been cut in order to reduce fuel consumption, thereby achieving a so-called "stop and go" function.

The super-excitation circuit receives at its input the voltage of the on-board network delivered by the battery and/or the alternator, and delivers across the excitation winding a voltage which is higher than the said on-board network voltage.

In the case where the alternator-starter would discharge itself into the on-board network, by being disconnected from the battery (this being the case known as "load dump" ir the terminology generally used in this field of technology), the regulator may include means which enable a power circuit breaker which supplies the excitation coil to be caused to open immediately, whereby to de-magnetise the alternator, and particularly its rotor, rapidly.

At the present time it is conventional to provide a power unit in which the rectifier bridge includes power transistors which are so connected as to constitute a bridge of interrupters, and in which the transistors are controlled in synchronism with the current present in an armature winding of the alternator (synchronous rectification). However, it is necessary to control the transistors by means of a control unit which is relatively sophisticated, such as for example a micro-controller, with current transducers detecting the direction of the current in the windings of the armature of the alternator, an image bridge, and so on. One of these rectifier bridges is described in the patent application FR-A-2 806 553. This rectifier bridge is shown in FIG. 1 of the present application. It comprises three branches B1, B2, B3 each having at least two transistors, each of which is connected with one phase $\psi 1$, $\psi 2$ or $\psi 3$, the supply line Ua from the on-board network, and the earth line GND. Each transistor T1 to T6 is governed by a control unit U1 to U6. These control units U1 to U6 together constitute the control unit of the power unit constituted by the bridge of interrupters. Each of these control units is arranged to compare a phase voltage of the alternator with a reference voltage, and to control one of the transistors of the rectifier bridge as a function of the result of the comparison. Each of the said control units includes means which are distinct from those of the other units and which are arranged to carry out, separately from the other units, a comparison and a compensation for variations in its reference voltage, in such a way that each unit does not necessitate any signal other than those which have the same variation as the phase voltage, and other than those having the same variation as its reference voltage. Each control unit U1 to U6 controls a power transistor T1 to T6.

The said control unit, like most control units known at the present time, requires the use of a large number of electronic components, because it is necessary to provide one control unit for each transistor of the rectifier bridge.

The components used in the construction of the power unit are therefore positioned and connected on a first electronic printed circuit, and form the power stage.

The components used for the control unit are positioned and connected on a second electronic printed circuit board.

The two electronic printed circuits, forming the control and power module, are connected together by means of electric wires. Now, the electrical connection of these two printed circuits makes it necessary to provide a large number of connections between the two stages. In consequence, the control and power module is relatively large in size, which makes it necessary to mount it in a casing which is separate from the casing that contains the electro-mechanical assembly of the alternator-starter.

Thus, by contrast with conventional alternators which are entirely integrated in the same casing, the alternator-starter makes it necessary to provide two casings, namely one casing which contains the machine itself and one casing containing the control and power module. An alternator-starter is therefore bigger than a conventional alternator. In addition, for the user it involves an additional difficulty in the assembly stage of the motor vehicle, because it is for the motor manufacturer to connect the two casings together.

DISCLOSURE OF THE INVENTION

The overall object of the invention is to provide a remedy for the disadvantages of the techniques described above. To this end, the invention proposes a control and power module which is miniaturised and which can be integrated into the casing of the alternator-starter machine. This module comprises a power unit in which the transistors of a common branch of the rectifier bridge are governed by a driver which is located close to the transistors and which is controlled by a management circuit which can be located at a distance from the driver.

Thus the present invention has the advantage of reducing the length of the connection between the drivers and the power unit. Since some of these connections are used for measuring purposes, for example measurements of voltage occurring in the power unit, the reduction in length of these connections dedicated to measurements enables high measurement precision to be guaranteed by eliminating parasitic disturbances which could affect long connections.

The driver of the control unit of the invention is able to control a plurality of transistors simultaneously, that is to say the transistors of a common branch of the rectifier bridge. This driver therefore has the advantage that it is very small, while at the same time containing a large number of functions. Because of its relatively small size, it can be located on the power stage, close to the transistors of the power unit which it controls.

More precisely, the invention provides a control and power module for an alternator-starter for a motor vehicle, connected between the alternator-starter, an on-board network and a ground line of the vehicle, comprising:
  a power unit including a transistor bridge having a plurality of branches, and
  a control unit, for the purpose of comparing a phase voltage of the alternator-starter with a reference voltage and for controlling the transistors of the power unit as a function of the result of the comparison, characterised in that the control unit comprises:
  a driver for each branch of the transistor bridge of the power unit, the said driver being connected close to the transistors of the branch of the power unit, and
  a management circuit for controlling the drivers.

DETAILED DESCRIPTION OF EMBODIMENTS OF THE INVENTION

Figure 1:
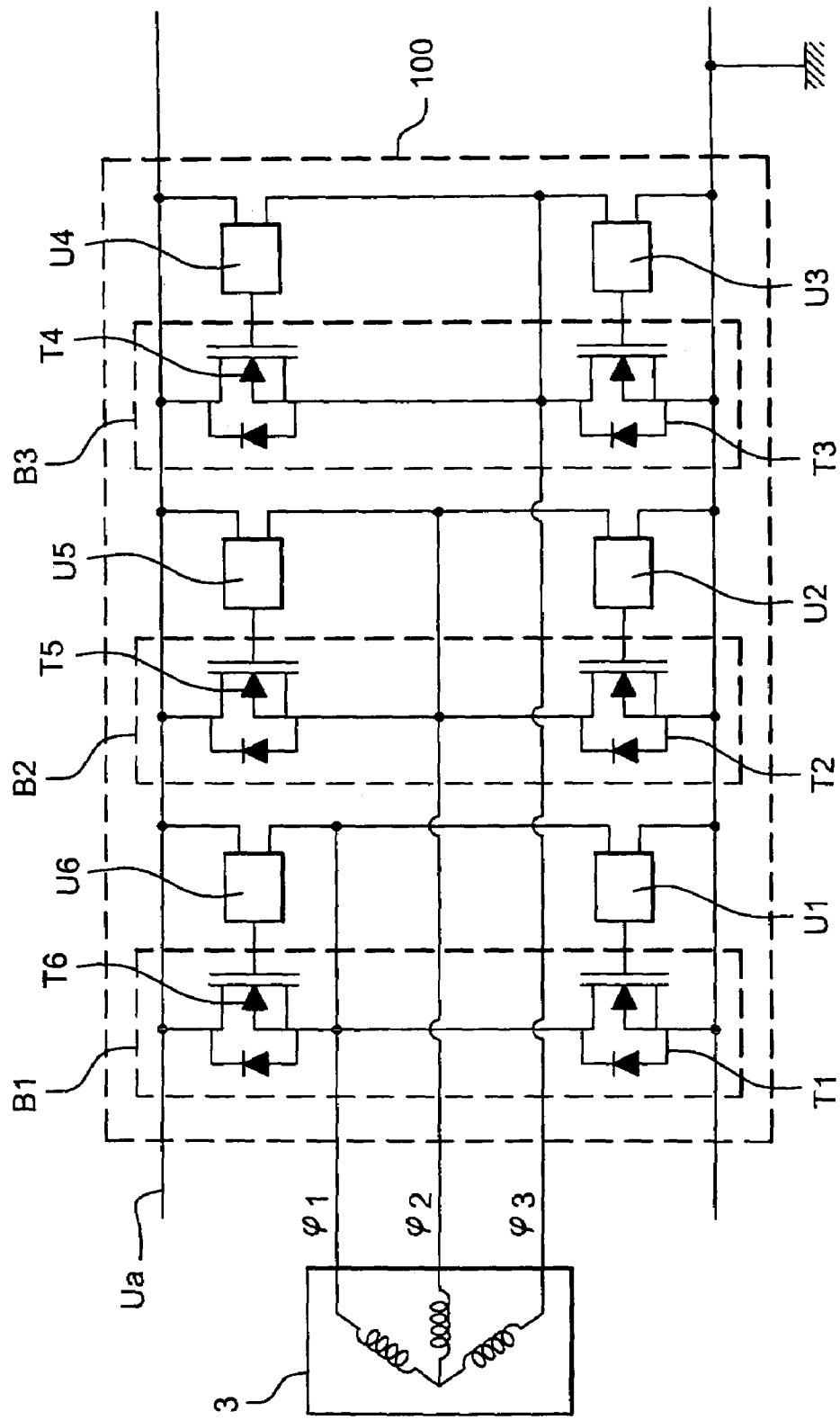
FIG. 1, already described, is a diagrammatic representation of a control and power module in the prior art.

In the drawings, those elements which are identical or similar to each other are indicated by the same reference signs. The supply voltage denoted by the reference Ua may also be denoted as B+.

Figure 2:
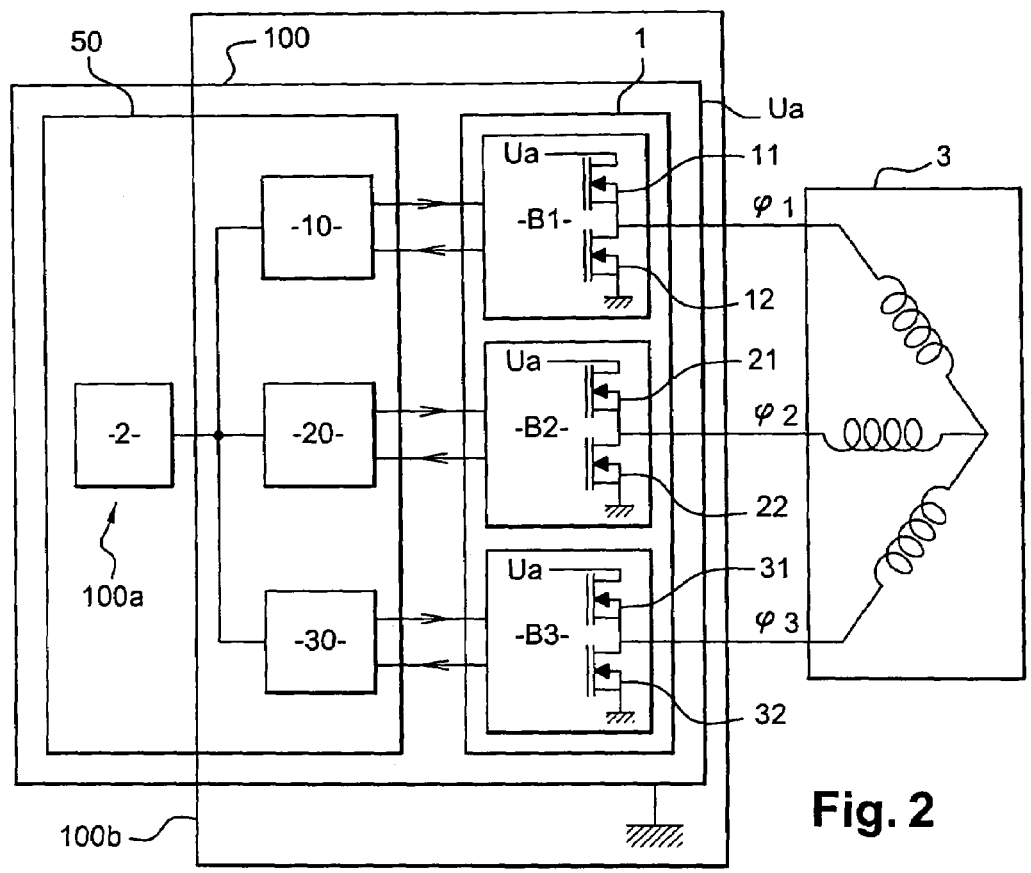
FIG. 2 shows a control and power module according to the invention.

FIG. 2 shows the control and power module 100 of the invention, connected to the alternator-starter. More precisely, FIG. 2 shows a three-phase machine 3 of this type, each phase ψ1, ψ2 and ψ3 is connected to one of the branches B1, B2 and B3 respectively of the power unit 1. All three of the branches of the rectifier or control bridge constituting the power unit 1 are identical. In consequence, only the branch B1 will be described in detail below.

The branch B1 of the rectifier bridge 1 includes two interrupters 11 and 12 which, in the invention, are power transistors. The transistor 11 is the "high side" transistor of the branch B1. It is connected between the phase ψ1 of the machine and the supply Ua from the on-board wiring network of the vehicle. The transistor 12 is the "low side"

transistor of the branch B1. It is connected between the phase ψ1 of the alternator-starter and the ground line GND.

The control and power module includes a control module 60 which comprises, firstly, the drivers 10, 20 and 30, each of which governs the power transistors of a common branch, and preferably these drivers compare the phase potentials ψ1, ψ2, ψ3 of the machine with the ground potential of the rectifier bridge, for the control of the transistor 12, and also with the output potential Ua of the rectifier bridge for control of the transistor 11, and the control unit comprises, secondly, a management circuit 2 for governing the drivers 10, 20 and 30.

The branches of the rectifier bridge, and the drivers that pilot them, constitute a first stage 100b of the module of the invention. The management circuit 2 constitutes a second stage 100a.

The driver 10 is connected at its output to the grids of the two transistors 11 and 12. The driver 10 is itself connected through its input to the management circuit 2.

All of the drivers 10, 20 and 30 are controlled by the same management circuit 2. To this end, each driver receives different input signals from the management circuit 2. These signals are represented in FIG. 3.

The said signals are divided into two categories, namely:
- signals indicated on the left of the driver: these are signals coming from the management circuit; and
- signals indicated on the right of the driver: these are signals received or transmitted to the power unit, that is to say to the transistors which the driver controls.

One of the signals received from the management circuit is the boost power supply denoted ALG, which is the power supply voltage supplied by an auxiliary source to the grids of the transistors 11 and 12. The driver also receives, from the management circuit, sensor signals SC which are items of information provided by the position sensors that detect the position of the rotor of the alternator-starter, so as to indicate the position of the rotor of the rotary electric machine. The control circuit also supplies to the driver an item of information VD for validation of the starter mode, and an item of information VA for validation of the alternator mode. These two last mentioned signals enable the driver to know whether the machine should be working, at a precise particular instant, as an alternator or as a starter.

Figure 3:
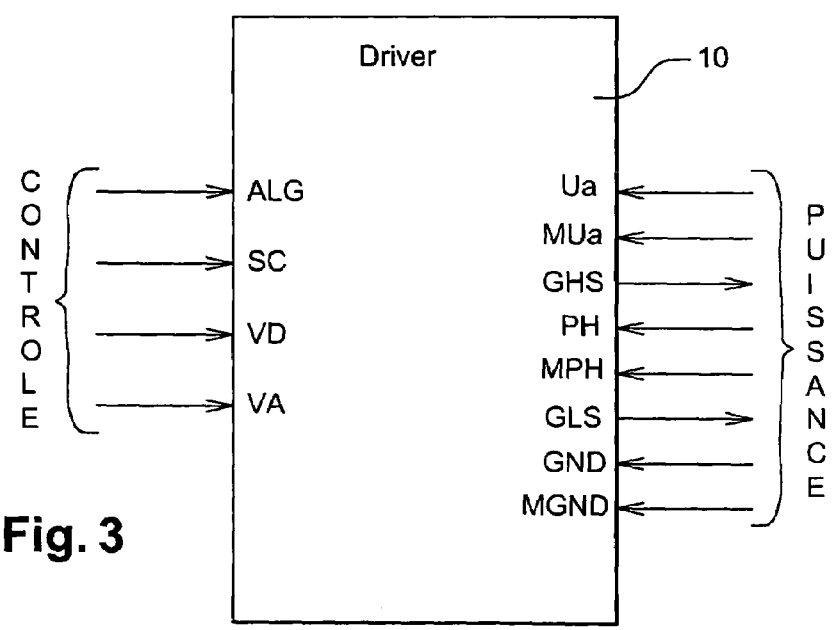
FIG. 3 shows the various connections of a driver in a control unit of the invention.

FIG. 3 also shows the signals received and transmitted to the power unit, that is to say to the transistors 11 and 12 of the rectifier bridge. The driver receives the power supply potential Ua of the alternator-starter, namely the power supply potential of the on-board wiring network. It also receives an item of information MUa, which is the measuring input of the potential of the line Ua. The driver supplies an output signal GHS which is the control signal for the grid of the power transistor 11. The driver further receives the phase input PH which comes from the alternator-starter, together with the measurement MPH of the phase input potential. The driver also supplies at its output the command GLS for the grid of the power transistor 12. Finally, the driver receives the ground potential GND and also the measurement MGND of the ground potential.

Figure 4:
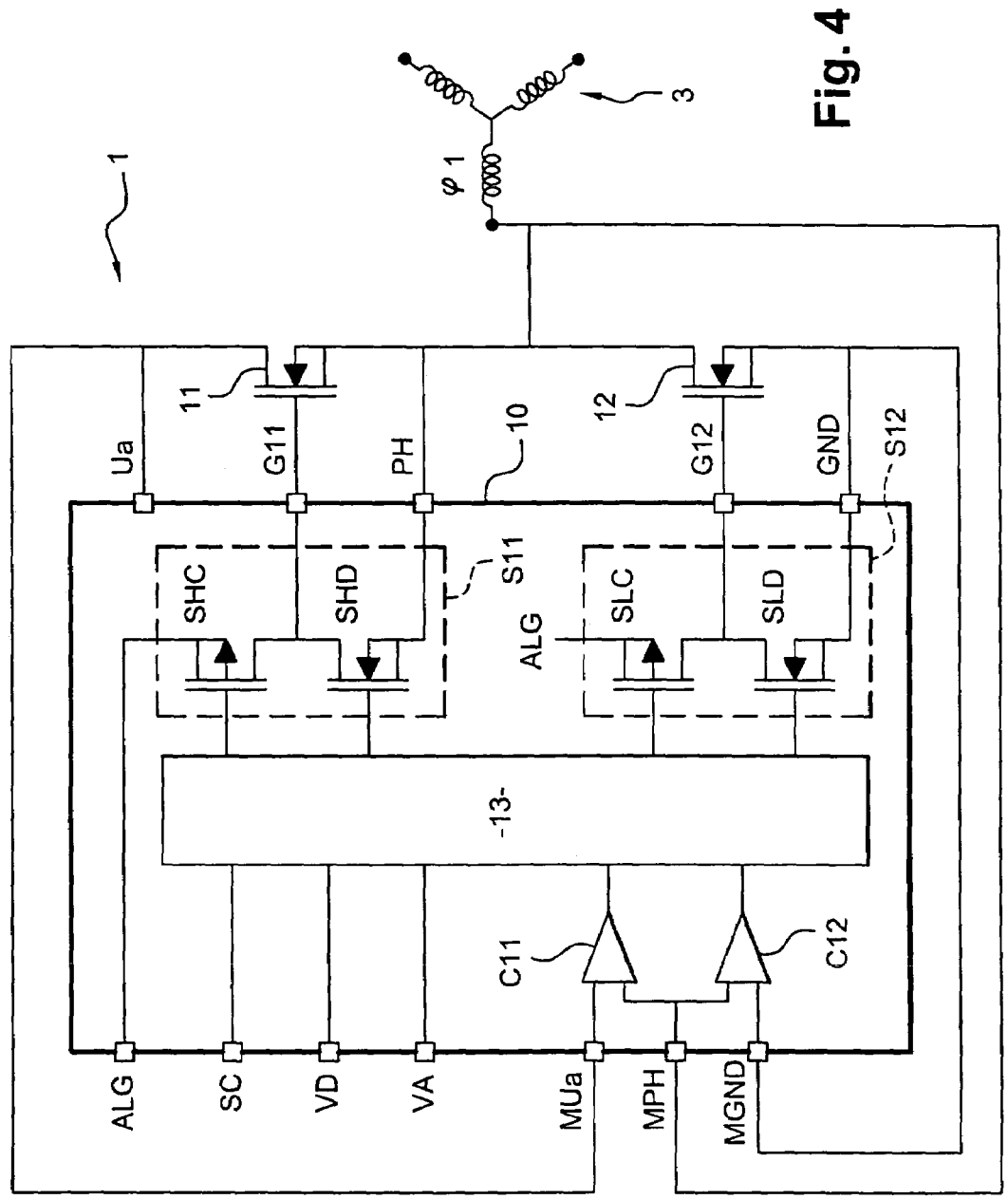
FIG. 4 shows the electrical connections between a driver and the transistors of the power unit which it controls.

FIG. 4 shows a driver 10, 20, 30 of the control and power module 100 of the invention, with its various components and its various connections. In FIG. 4, the alternator-starter 3 supplies a phase signal ψ1 to the low side transistor 12 and the high side transistor 11, and also to the input PH of the driver. It also supplies the phase measurement to the driver 10 on its input MPH.

In FIG. 4, the inputs for the measurements MPH, MGND and MUa have been shown on the left of the driver, merely in order to simplify the drawing. In practice, and as shown in FIG. 3, these three inputs are placed on the right hand side of the driver, that is to say on the same side as the power unit.

The transistor 12 is connected to ground GND and also to the input MGND of the driver. The transistor 11 is connected to the line at voltage Ua and also to the input MUa of the driver.

Two comparators C11 and C12 are connected, respectively, between the inputs MUa and MPH and between the inputs MPH and MGND of the driver. The output signal from the comparator C11 supplies a value of a comparison between the value of the phase MPH and the value of the reference voltage MUa. The output signal from the comparator C12 supplies a value of a comparison between the value of the phase MPH and the value of the ground potential MGND. These comparison values are then processed digitally by a logic circuit 13, for the purpose of deducing from them whether it is the grid of the transistor 11 and/or the grid of the transistor 12 that must be charged and/or discharged. The grids G11 and G12 of the respective power transistors 11 and 12 are charged and discharged by current sources S11 and S12 respectively. The current sources S1 are derived for example from two transistors SHC and SHD. The current sources S12 are derived for example from two transistors SLC and SLD. Thus each transistor constitutes a current source.

The input ALG is at a high voltage delivered by the management circuit 2, for correctly charging up the grid of the power transistors 11 and 12, through the interposed current sources S11 and S12. The potential ALG can for example be represented as ALG=Ua+16V.

The operation of the driver of FIG. 4 is as follows. In the starter mode, position sensors, placed on the rotor of the alternator-starter which is working in synchronous machine mode, mark the position of the rotor. The sensor signals are transmitted to the management circuit 2, which processes them and applies them to the inputs SC of the drivers. The grids G11 and G12 of the transistors 11 and 12 are controlled as a function of the signals received on the input SC, through the interposed logic circuit 13 and the current sources S11 and S12.

In the alternator mode, the power transistors 11 and 12 perform a synchronous rectification function, that is to say the comparators C11 and C12 detect the phase level on the input MPH with respect to the ground potential MGND on the input, and with respect to the output potential on the input MUa. The result of this comparison is applied to the grids G11 and G12 through the interposed logic circuit 13 and the current sources S11 and S12.

The alternator or starter mode is selected on the driver by the respective logic inputs VA and VD. For example, when the alternator mode is selected, the input VA receives a logic signal at 1, and the input VD a signal at 0. And inversely, when the starter mode is selected, the logic level 1 is for example a voltage of 5 volts, and logic level 0 is a zero voltage.

The inputs of measurements of the phase MPH, the potential MUa and the ground potential MGND enable the effects of disturbances set up by currents flowing in the connections PH, Ua and GND to be avoided. These disturbances may be caused for example by the resistance of the connections between components and either each other or the substrate of the electronic printed circuit board.

Because each driver is situated close to the potentials PH, VA and GND to be measured, the measurement inputs MPH, MVA and MGND make use of connections of reduced length, which reduces, in proportion to this, the sensitivity of the said inputs to disturbances which may pass through these connections, and this is a further justification for the architecture proposed by the invention.

On the other hand, the management circuit 2 may be spaced apart from the drivers, because it only transmits potentials which are hardly critical (i.e. the power supply potential ALG, or logic levels VA, VD, SC), by contrast to the measurement inputs (for the quantities MPH, MVA and MGND).

The grids of the transistors 11 and 12 may be able to be brought to potentials higher than the output potential Ua of the alternator-starter. With this in view, the control circuit delivers on the terminal ALG a voltage Ua+16 volts, ±1, which enables the grids G11 and G12 of the transistors 11 and 12 to be energised. If the voltage at the terminal ALG is insufficient, the power transistors 11 and 12 are then open.

The operation of the control and power module 100 of the invention will now be described. In the rest condition, that is to say when the vehicle is at rest and when the ignition key is "open" (that is to say the key is not turned in the ignition switch), then the transistor 11 is open while the transistor 12 is closed. This condition is obtained when the logic inputs VD and VA are both at level 0. When the engine of the vehicle is stopped, with the ignition key open as described above, the management circuit 2 is inactive and is unable to deliver the voltage Ua+16V to the input ALG of the driver. In consequence, a voltage having a minimum value of Ua−1V is applied on the grid G12 of the transistor 12.

In other words, when the key is "open", i.e. the ignition is switched off, with VD and VA at 0, then the grid voltage of the transistor 11 is smaller than or equal to 0.2 volts, and the grid voltage of the transistor 12 is higher than Ua−1V. In other words, the transistor 12 is closed when the transistor 11 is open, which maintains the potential of the stator at ground potential.

The current consumed by the driver under these conditions is less than 10 microamperes at 25° C.

When the vehicle is at rest, and the ignition key is turned in the ignition switch (that is to say the ignition key is said to be "closed"), then this causes the control circuit 2 to be brought into use. The management circuit 2 is then active and is able to deliver the voltage Ua+16V to the input ALG of the driver. Under these conditions, the grid potential G11 of the transistor 12 [sic] is limited to 15±1V. In other words, when the key is closed and VD and VA are at 0, then the grid voltage of the transistor 11 remains lower than or equal to 0.2 volts and the grid voltage of the transistor 12 is equal to 15±1 volt.

In the starter mode, the validation inputs VD and VA are no longer both at 0. The starter mode also brings into use the sensor signal input SC. Thus, in the starter mode, the rectifier bridge works as a wave generator. Each branch of the rectifier bridge is synchronised with the sensor signal SC applied to the corresponding driver. The mode of operation as a wave generator is obtained when VD is at 1 with the input VA at 0.

Thus, if SC=0 and VA=0 and VD=1, then the grid voltage G11 of transistor 11 is smaller than 0.2 volts and the grid voltage G12 of the transistor 12 is equal to 15±1 volt. On the other hand, if SC=1 and VA=0 and VD=1, then the grid voltage G11 of the transistor 11 is equal to 15±1 volt and the grid voltage G12 of the transistor 12 is less than 0.2 volt. The control and power circuit 11 then works as a wave generator, with the voltages applied on the phases PH1, PH2 and PH3 being linked to the position of the rotor as a function of the signals SC1, SC2 and SC3 delivered by the position sensors after processing by the management circuit 2.

In the alternator mode, the rectifier bridge works in synchronous rectification. This function is activated when the validation input VA is at 1 while the input VD is at 0. In this case, the comparators C11 and C12 of the driver compare, firstly, the phase voltage Ph with the voltage Ua, and secondly, the phase voltage PH with the ground potential GND. The result of this comparison enables the transistors 11 and 12 to be opened and/or closed in synchronism with the currents flowing in the armature windings of the alternator-starter. The effect on the grids of the transistors 11 and 12 is as follows:

if PH>Ua, and VD=0, and VA=1, then the grid voltage G11 of the transistor 11 is equal to 15±1 volt and the grid voltage G12 of the transistor 12 is less than 0.2 volt, and in consequence the transistor 11 is closed and the transistor 12 open.
 if Ua>PH>GND, and VD=0, and VA=1, then the grid voltage G11 of the transistor 11 is less than 0.2 volt, and the grid voltage G12 of the transistor 12 is also less than 0.2 volt, and in consequence the transistors 11 and 12 are closed.
 if GND>PH, and VD=0, and VA=1, then the grid voltage G11 of the transistor 11 is less than 0.2 volts and the grid voltage G12 of the transistor 12 is equal to 15±1 volt, and in consequence the transistor 12 is closed and transistor 11 open.

In a conventional rectifying mode, the control circuit 2 is able to control opening of all the power transistors 11, 12, 21, 22, 31 and 32 of the rectifier bridge in order to eliminate the synchronous rectification. This operating mode is obtained when the two validation inputs VD and VA are at logic level 1. Rectification is then carried out by the diodes appropriate to MOS transistor technology.

In that case, when VD=1 and VA=1, then the grid voltage G11 of transistor 11 and the grid voltage G12 of the transistor 12 are both less than 0.2 volts.

The grid voltages of the power transistors 11 and 12 are controlled by constant current sources, omitted from the Figure for reasons of simplification. Control of the closing operation is achieved by a grid charging current of 100 milliamperes for example, and control of opening by a grid discharge current of 400 milliamperes for example.

Figure 5:
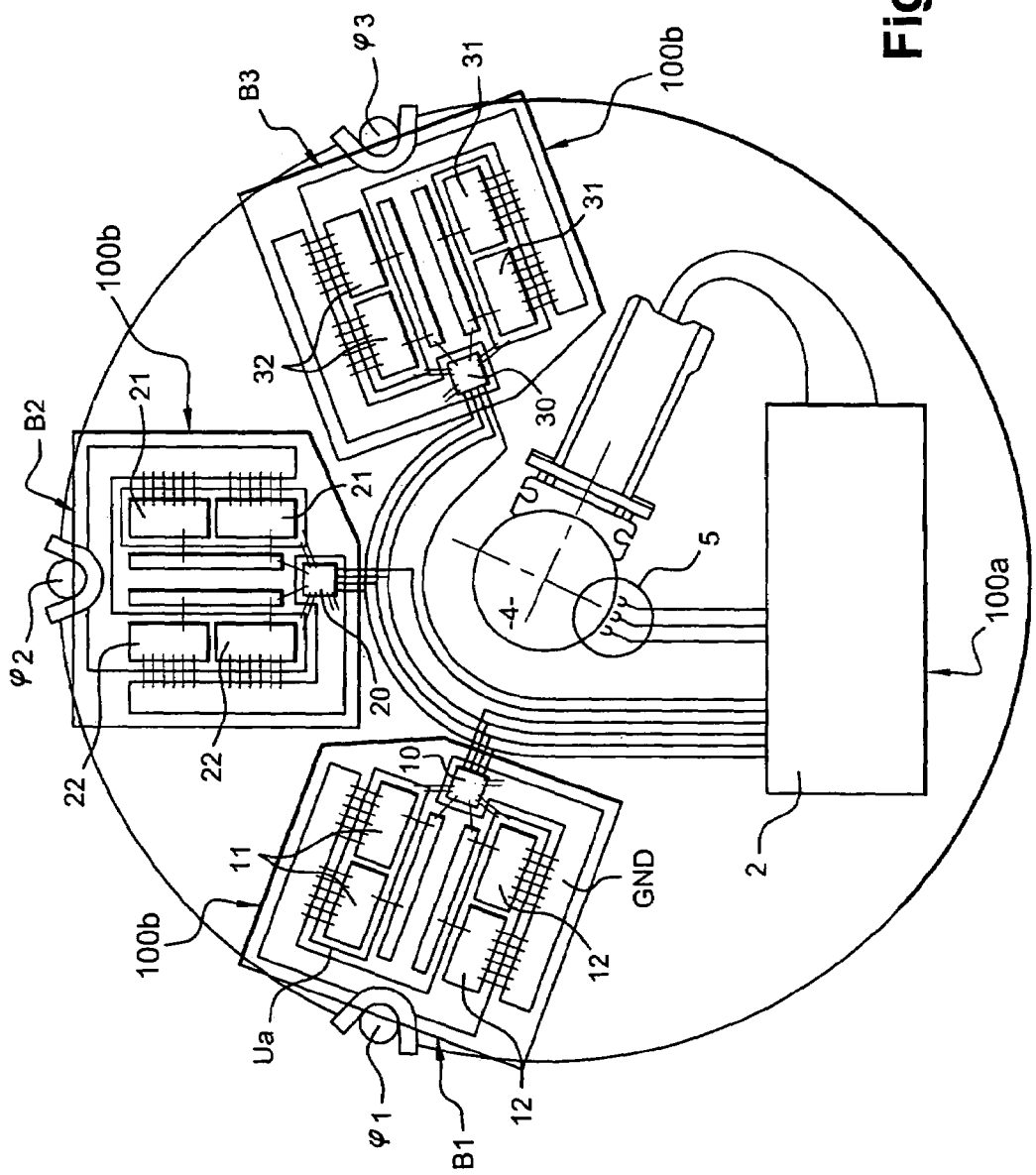
FIG. 5 shows a method of integrating the control and power module of the invention in the rear of a casing of an alternator-starter machine.

FIG. 5 shows one example of the integration of the control and power module of the invention in the rear of an alternator-starter machine. In this connection, the fact of making use of a single driver for controlling the two transistors of a common branch of the rectifier bridge enables the number of connections to the management unit 2 to be reduced.

In particular, the driver is arranged in such a way that, on one side, it includes only connections going towards the power unit, while on the other side it has connections only going towards the management unit 2. In this way, the driver can easily be connected close to the power transistors which it controls. In addition, in this embodiment, only four connections are necessary between a driver and the management circuit 2, three of these four connections being, in addition, common to all of the drivers. It is therefore easy to separate the management circuit 2 from the drivers. The size of the management circuit 2 resulting from this separation is thus very much reduced. The management circuit 2 can then be integrated in another item of equipment of the vehicle.

In the example in FIG. 5, the control and power module 100 is integrated in the rear of the alternator-starter. In FIG. 5 the rear face of an alternator-starter can be seen, with its phase outputs and its rotor. In the case of FIG. 5, each driver is positioned close to the power transistors which it controls, the whole being situated close to one of the phase outputs of the alternator-starter. For example, the driver 10 is connected only on the side of the transistors 11 and 12 of the branch B1 of the rectifier bridge, the assembly of transistors and driver being located close to the phase output ψ1 of the machine. Similarly, the driver 20 and the transistors 21 and 22 of the branch B2 of the rectifier bridge are placed on the same side as the phase output ψ2, and the driver 30 and the transistors of the branch B3 are placed on the same side as the phase output ψ3 of the machine.

In the example of FIG. 5, each branch of the rectifier bridge comprises a plurality of high side transistors and a plurality of low side transistors. In this connection, as is conventionally the case, a plurality of transistors (often two to four) are connected in parallel, in such a way as to constitute a bigger power transistor. Whether there is only one power transistor, or whether there is more than one, connected in parallel, the operation is identical to the one just described.

The end of the shaft 4 (indicated diagrammatically by a circle in FIG. 5) which carries the rotor of the rotary electrical machine includes position sensors 5, which supply indications as to the position of the rotor to the management circuit 2. This information about the rotor position is processed by the management circuit 2 and is then transmitted to the inputs SC of the drivers 10, 20 and 30.

Preferably, the connections made between the management unit 2 and the various drivers define a circular arc positioned around the shaft 4 that carries the rotor.

In the case of FIG. 5, the power and control module 100 is integrated in the casing of the alternator-starter. This assembly may also be incorporated in another item of equipment of the vehicle, for example in the battery charge management unit.

It is also possible to incorporate only the power unit, with its respective drivers 10, 20 and 30, and to place the management circuit 2 in a housing outside the alternator-starter. For example, the management circuit 2 may be incorporated in the battery housing, or even in the battery management unit housing, or, again, in the management unit for controlling other power consuming parts.

In a further embodiment, the control and power module 100 is integrated in an independent housing outside the alternator-starter, but more compact than in the prior art.

Figure 6:
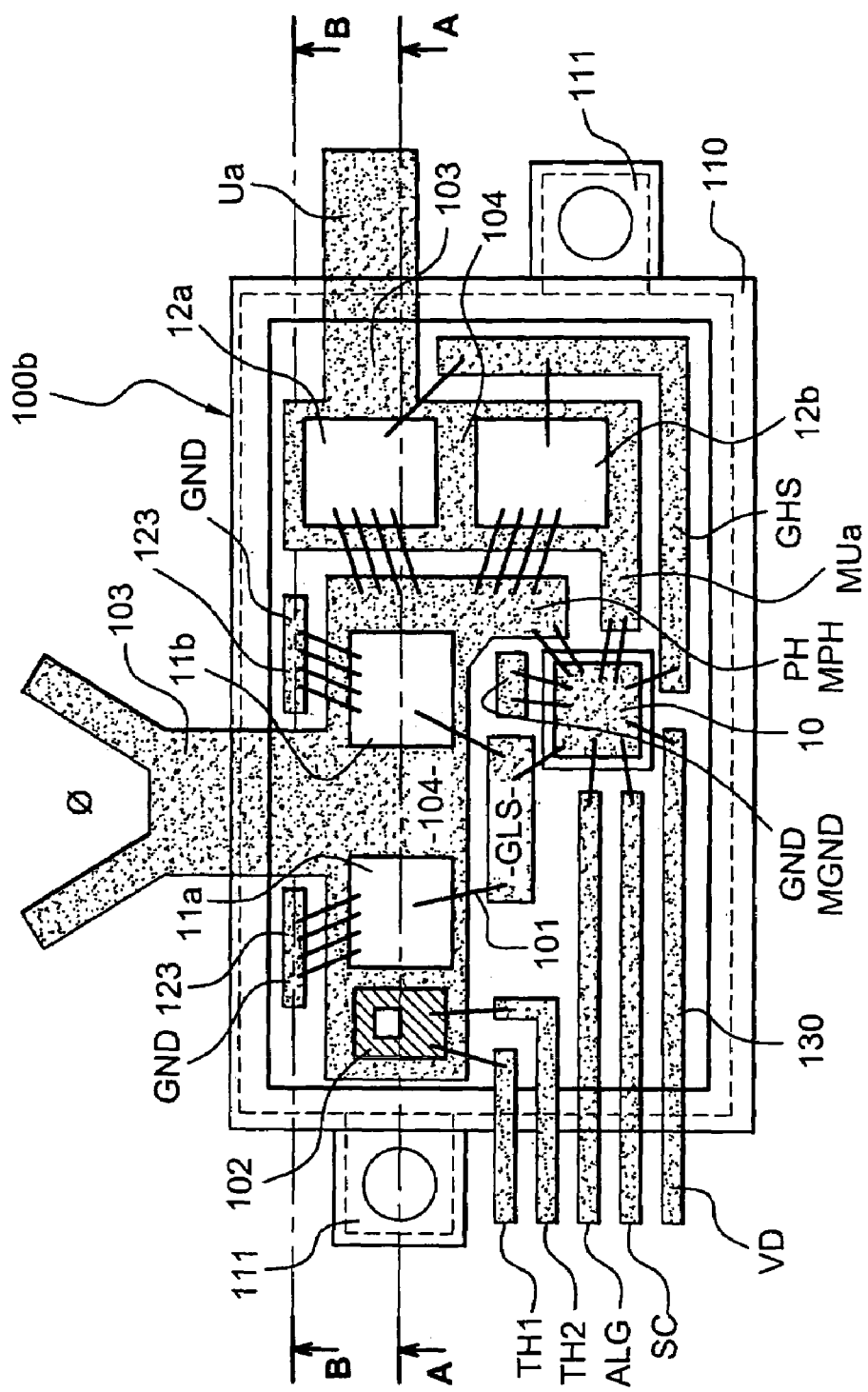
FIG. 6 is a view in elevation of an embodiment of a power module according to the invention.

FIG. 6 shows one example of an embodiment of the first stage 100b of a control and power module 100 according to the invention. As described above, this first stage includes, for each of the rectifier arms, each corresponding to one phase of the stator, a measuring and control driver together with the two power transistors. Thus, if a first arm of a rectifier or control bridge is considered, we have the driver 10 together with the two power transistors 11 and 12 described above.

According to the invention, the said first control and power stage is preferably arranged within an independent housing. Since the three bridge arms are identical, it is thus possible to make use of a power housing which is identical for each of the bridge arms.

As can be seen in FIG. 6, which shows a first stage of a control and power module in elevation, the electronic power components 11 and 12 are placed on metallic tracks 104.

Preferably, the technology used is the so-called chip transfer, or bare chip, technology, in which the component, having no protective housing, is fixed directly on a support. In this connection, the electronic housing, placed under the engine compartment hood of the motor vehicle, is subjected to high thermal stresses, and it is necessary to avoid making use of components under plastics housings. It is therefore preferable and advantageous to make use of components with metallic housings, or components mounted according to these so-called chip transfer techniques, in which the component is transferred to a metallic track. The network obtained by the assembly of the metallic tracks constitutes what is called the lead-frame.

In order to control the phases of the winding of the electrical machine in the starter mode, it is necessary to inject very high currents. These currents can reach a value of about 1000 amperes when the apparatus is working under a conventional on-board network voltage of about 12 volts. Thus, the low side transistor 11 and high side transistor 12 may be constituted by arranging in parallel at least two power transistors 11a, 11b and 12a, 12b respectively.

Preferably, the power module 100b includes a thermistor 102 (temperature sensor) which is accessible by means of the connections TH1 and TH2.

The driver 10 is subjected to temperatures which are generally smaller than those present at the level of the power transistors. The same is true for the tracks which constitute the control or measuring signals ALG, SC, VD, GLS, GHS, TH etc. for the operations described earlier herein.

Since the control of an alternator-starter causes very high currents to appear, a very large number of design problems are presented to the person working in this field in order to make a control unit of small size which is adapted to distribute the currents and the temperature in a balanced way within the module.

Thus, in accordance with the invention, each module, corresponding to one arm of the bridge, is connected to each of the phases and functions independently, without any currents from the other modules passing through it. Thus the track that carries the output Ua is connected at a single place to a power conductor which collects the currents that come from all the modules. Each of the modules therefore works independently, without the currents relating to the other modules passing through it or disturbing it. In addition, the power transistors 11a and 12a are preferably assembled in a manner which is perfectly symmetrical on the metallic track with respect to the phase input ψ1. We will then obtain a distribution of current which is in perfect equilibrium. Similarly, for the high side power transistors 12a and 12b, these latter are mounted on their metallic track in the most symmetrical way possible for the same reasons. This is very important so as not to unbalance the currents in the power transistors, which must work in parallel with identical currents. Thus, in order to obtain a power module which has good current balance according to the invention and as shown in FIG. 6, the low side and high side power transistors are mounted so as to be substantially at right angles to each other. This configuration has the further advantage that it enables all the connections to be made by wire bonding, without providing any covering above the signal or power tracks whatsoever. Thus, all of the connections are made with conductors 101 which are short in length, and this has the advantages of giving a reliable module which is strong, and in particular is resistant to vibrations. In this connection, the automotive environment contains much vibration, and the wires for connection by bonding are subjected to severe vibrations which can break them and contribute to disfunctioning of the alternator-starter system. Maximising the reduction in the length of these connecting wires increases their resonant frequency, which makes them insensitive to the vibrations which are applied to the power module.

As was indicated earlier herein, one object of the invention is to provide a control means for an alternator-starter which is compact and which has a high cooling power, while presenting high operating reliability over time.

In order to obtain such a power module which is adapted to withstand currents that may rise to about 1000 amperes, the state of the art proposes certain solutions.

The power module could be made in accordance with the known methods with a substrate of the Direct Bounded [sic] Copper Substrate (or DBC type), which comprises three layers. A first layer consists of an engraved metallic track which constitutes the connections of an electrical circuit, a second or intermediate layer is a plate of electrically insulating material such as a ceramic, for example aluminium oxide, and a third layer is a metallic plate consisting of copper or nickel plated copper. In this way a structure is obtained consisting of a copper-aluminium-copper sandwich.

The assembly consisting of the direct bounded copper (DBC) substrate, together with electronic power components which are brazed or adhesively bonded on it, is in its turn brazed on a copper plate which constitutes a mechanical support and a thermal dissipater. In this technology, the copper tracks are very thin, so that in order to pass high currents it is necessary to increase considerably the surface of the tracks, and this makes the size of the power module very much greater. In addition, this technology is not applicable to applications which relate to high currents, because the thermal capacity offered by the low thickness of the copper is insufficient. Moreover, it is very difficult to make particular forms, such as rounded forms, which are more particularly adapted for being integrated on applications such as, for example, the rear of a rotary electrical machine, because of the fragility of the aluminium. In addition, aluminium has poor resistance to vibrations such as those which are present inside a motor vehicle engine unit.

The substrate may also be of the insulated metallic substrate (IMS) type. In this case, the ceramic plate is replaced by a resin plate which is able to support a first layer that consists of a metallic track comprising very thin copper. The third or thermal dissipation layer can in this case consist of a metallic plate of aluminium or copper.

In the case where the substrate used is a substrate of the DBC type, the power module is robust and will support a high power, but its selling cost has to be high. In the case of a substrate of the IMS type, the stamped metallic track can be more complex, and an increased number of electronic power components can be arranged on it, but the module is less able to withstand high powers and severe stresses imposed by its environment. However, it is possible in IMS technology to add an additional copper interface which is interposed between the chip and the metallic track of thin copper, in order to enable heat to be evacuated more effectively. This solution is complex to achieve and is not very satisfactory from the cost point of view.

In both cases, the thermal path between the electronic power components and the cooling means outside the power module is long, because it is necessary to traverse at least the numerous layers of the substrate which are inherent in these two techniques.

The invention aims to provide a remedy for the disadvantages of the conventional power modules, by providing a power module with a reduced manufacturing cost, and in which the structure enables effective cooling to be obtained with the aid of external cooling means and by virtue of the small number of thermal interfaces that have to be passed through.

Figure 7:
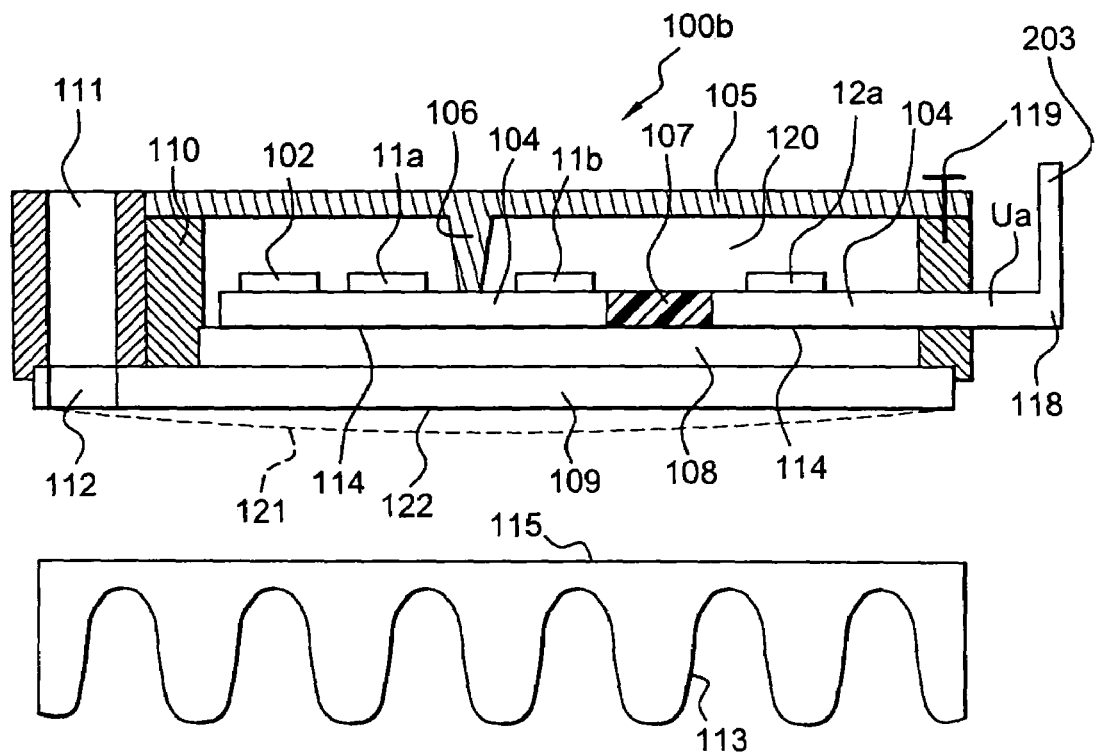
FIG. 7 is a view in cross section taken on the line A—A in FIG. 6.

Thus, as shown in FIG. 7, the power module includes metallic power tracks 104 which are adapted to receive for example the power components 11a and 11b connected to the phase output of the stator winding of the electrical machine. This metallic track may also carry a thermistor 102 for taking the temperature of the module. The power module, as described earlier herein, may include other metallic power tracks 104. Thus, as shown in FIG. 7, a further metallic power track carries the power component 12 connected to the output +Ua in our illustrative example.

Preferably, the said metallic tracks are made from a single conductive metallic plate, in which the metallic tracks are formed for example by stamping. Preferably and in order to obtain a compact module according to the invention, the metallic tracks made from the metallic plate, which is preferably of copper, is of high thickness for passage of high currents. Thus, the thickness of these tracks can vary between 0.6 millimetres and 2 millimetres. The above mentioned current techniques do not enable tracks of such a thickness to be obtained within the substrate itself. In this connection, the thicknesses usually employed in the manufacture of these tracks never exceeds 400 micrometres of thickness. For reasons which will be clear, it cannot be envisaged that tracks of such a thickness can be made by conventional engraving operations.

In order to ensure good positioning of the tracks with respect to each other, metallic bridges are made during the stamping-out operation. Quite clearly these metallic bridges will be removed in a deshunting (parting) operation which will be carried out at the end of the process.

Preferably, in order to simplify the construction of the power module, the low power metallic tracks which are intended for example for the control signals can also be made from the said thick metallic plate, their positioning being also obtained by means of metallic bridges. All of these metallic tracks together constitute the lead frame.

In order to obtain a lead frame having a good mechanical cohesion, it is necessary to arrange it with a device for serving as a support. In addition, this support must be adapted for effective evacuation of heat emitted by passage of high currents. Thus, according to the invention, it is proposed to inject a resin 107 into the spaces left free between the metallic tracks. This operation can easily be carried out by placing a lead frame between two plates constituting the mould used for injection. Thus, at the end of the operation of injecting the resin, all of the interstices between the tracks are occupied by the resin. The deshunting operation can then be carried out at the end of this operation.

Preferably, the said resin will be of a thermoplastic type such as phenylene polysulphide (PPS), or polyamide 6.6 (PA 6.6), or polybutylene teraphtalate (PBT). PPS also has the advantage that it is non-flammable (standard ULL 94V0).

Figure 8:
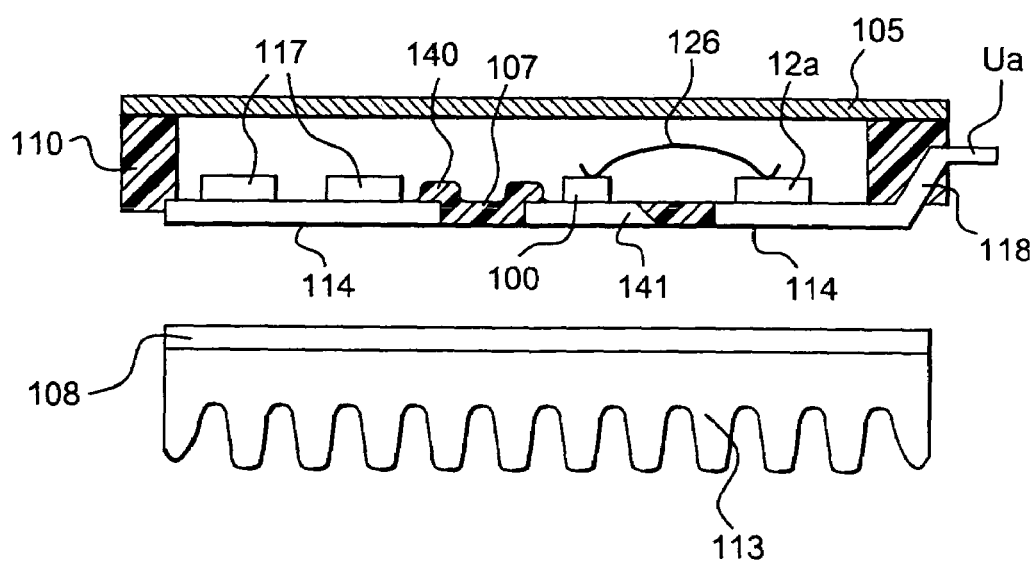
FIG. 8 is a view in cross section of the construction of a power module in another embodiment.

In order to increase the mechanical cohesion of the support consisting of the lead frame and the resin, the moulds may include openings so that the resin will locally cover the metallic tracks over a small portion 140, as can be seen in FIG. 8. In the same spirit, the edge of the metallic tracks can have particular forms, such as a chamfer 141 to improve the anchorage of the resin.

After the deshunting operation, the components, and particularly the power components, can be fixed on the metallic tracks, for example by brazing in accordance with a laser heating process or in an oven (by convection heating or infrared heating). This brazing operation gives electrical contact and thermal contact between the component and the metallic track.

Thus, according to the invention and as illustrated in FIG. 8, an electronic power component is obtained in which the metallic tracks, in particular tracks carrying the power components 117, are accessible from the outside through the faces 114 opposite to those which carry the said components.

The support for the power module according to the invention is made in such a way that at least the metallic power tracks are partly accessible on their upper and lower faces, the upper face being adapted to receive the electronic power component and the lower face 114 being adapted to cooperate with a cooling device, such as the dissipater 113 shown in FIG. 7. Preferably, the accessible portions of the lower faces of the metallic tracks are in line with the power components which they carry on their opposed upper faces, so as to obtain good cooling of the said power components.

In order to ensure good thermal contact between the said faces 114 and the upper face 115 of the dissipater 113, it is arranged to put an element 108, which is preferably an elastic thermal conductor but an electrical insulator, for the purpose of, firstly, effectively evacuating the heat, and secondly, electrically insulating the metallic tracks from each other. Such an element can for example be a piece of woven glass impregnated with an epoxy or polyamide (TVI) resin or with a thermally conducting thermoplastic resin of the phase change kind. A thermally conductive material which is also electrically insulating, having two adhesive faces, or a thermally conductive adhesive 108, containing pieces of glass that constitute spacers, may also be suitable. Phase change resin has the advantage that it flows under the action of heat. Thus, if the radiator or the lower face of the power module has errors of flatness, then this phase change resin is able to smooth out these irregularities. Preferably, the tracks which are brought out of the module so as to communicate with the outside have, advantageously, a bend 118 which is oriented upwards from the module in such a way as to space them away from the top surface 115 of the dissipater 113.

Such a module, corresponding to each of the arms of the bridge, is able to be made in high quantity production. In this case, it will have to have very high mechanical cohesion while retaining its ability to evacuate heat. Thus, as is shown in FIG. 7, it is arranged that a metallic plate 109, forming a base at ground potential, is placed under the power module. This base is held in an insulating housing 110, which is preferably formed by in situ moulding. For mechanical strength reasons, this housing is preferably made in PPS. A cover plate is fixed over the said housing, which, for the same reasons, is also of PPS.

The cover plate is secured for example by means of screws 119, which penetrate into the housing 110. In other embodiments, the cover plate may be fixed for example by adhesive bonding, or by means of welding such as ultrasonic or friction welding.

Inside the power module, under the cover plate 105 of the power module, a filling material 120 may be deposited so as to fill the free spaces around the electronic components and between the wire connections, which are for example of the wire bonding type. Apart from its sealing function, this filling material 120 has the advantage that it reinforces the mechanical cohesion of the support which is constituted by the metallic tracks and the resin surrounding them.

In the embodiment shown in FIG. 7, an electrical and thermal insulator is placed between the metallic base 109 and the lower face 114 of the metallic tracks. As described above in connection with FIG. 8, this thermally conductive electrical insulator 108 may be of TVI or a thermally conductive thermoplastic resin of the phase change type. Preferably, this insulator is adhesively bonded on both its faces, firstly on the side of the metallic tracks and secondly on the side of the metallic base 109. Thus, this base provides effective protection for the metallic tracks, and thereby enables a module to be obtained which has good mechanical adhesion and is easy to handle.

The said base 109 is made of a thermally conductive material, and is part of the dissipater element in contact with the lower face 114 of the metallic tracks which are to be cooled.

As can be seen in FIG. 7, a finger 106, which preferably projects integrally from the protective cover plate 105, engages against at least one metallic track. In the case where a filling material 120 is introduced above the electronic components, the filling materials are placed around this finger.

The finger contributes firstly to the provision of good mechanical cohesion of the assembly of the power module, by forming a rigid module, and secondly, the finger, which presses against the metallic track during fastening of the cover plate, for example by screw fastening, causes a slight bulge 121 to occur in the lower face 122 of the metallic base of the power module.

Thus, according to the invention, this bulge in the lower face 122 of the power module also contributes to good evacuation of heat to the dissipater. In this connection, when the power module is secured, for example by screw fastening, on the dissipater 113 by the screw holes 111, then the bulge, under the pressure exerted in the screwing-up operation, ensures perfect flat overall contact of the power module against the dissipater element 113, thereby ensuring good electrical contact between the base 109 and the dissipater 113. The screw hole 111, which in one embodiment extends through a hole 112 in the base, may also be formed by in situ moulding for its upper part, in PPS for strength in relation to the forces in the screwing-up operation.

In another version, a thermally conductive material such as TVI may be placed between the radiator and the power module. In that case, the ground connection will be taken by an electrical connecting means such as a terminal, which connects the base 109, at the level of the hole 112, to the connecting cover plate, and this connecting means passing for example through a hole 606 in the cover plate. The said terminal will of course be electrically insulated from the dissipater 113.

In another version, the finger 106 may be replaced by a wall or a small wall portion moulded on a part of the tracks during the moulding operation of the housing 110. The height of this small wall will of course be determined in such a way that the operation of fastening the cover plate 105 exerts a sufficiently high pressure on the small wall to cause the base 109 to be slightly bulged.

The power components 11a and 11b are connected between ground and the phase output of the stator winding. In starter mode, they carry very high currents. The ground connections must be as short as possible in order to limit the dissipation of heat. One solution would consist for example in bringing pads at ground potential into the housing 110 and to make the said connection to these pads. However, the length of the said wires would be quite long.

Another solution which can be seen in FIG. 7 consists in connecting to ground potential directly from the metallic plate 109 which constitutes the base.

Figure 9:
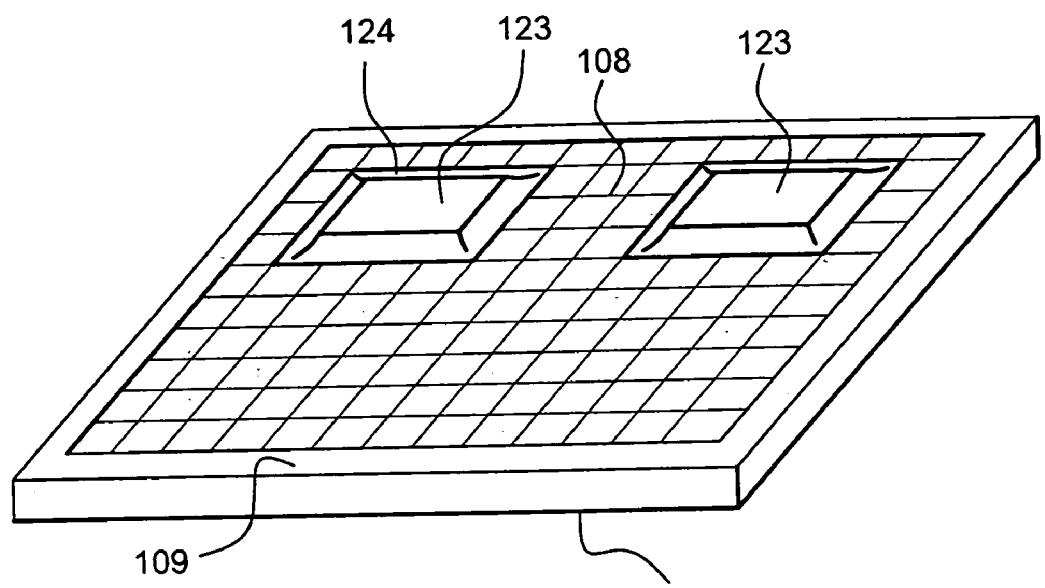
FIGS. 9 to 11 show one way of making the ground connection of the embodiments corresponding to FIGS. 6 to 8.
Figure 10:
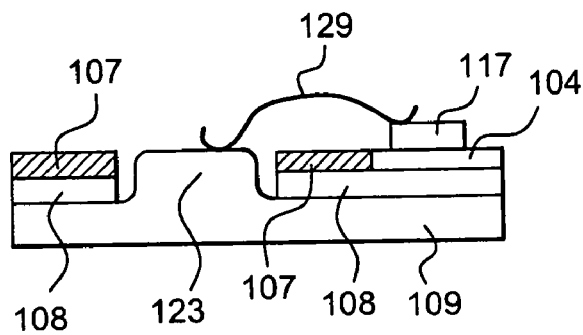

In a first embodiment, as can be seen in FIGS. 9 and 10, bosses 123 are formed on the base. These bosses are adapted to receive the connecting wires 126 in constructing the power circuit. These connections are preferably of the wire bonding type. During the process of moulding the resin at the level of the metallic tracks, it will clearly be necessary to provide openings 124, free of resin, to enable the pads of the boss 123 to pass upwards. Similarly, the insulator 108, such as TVI mentioned above, will preferably have to be pressed out beforehand in order that it is able to be positioned around the pads 123. Such a configuration has the advantage that its connecting wires are very short.

Figure 11:
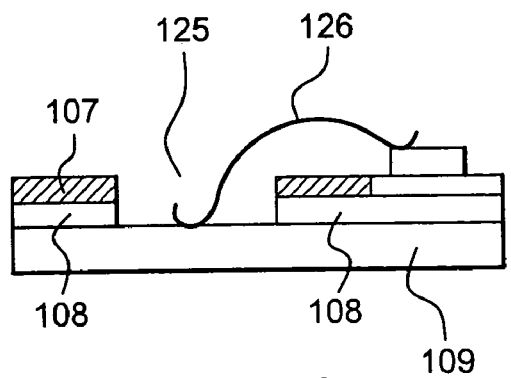

In another version and as shown in FIG. 11, an aperture in the resin 107 and in the insulator 108 is formed in such a way as to reach the metallic base 109, constituting ground, directly. This solution enables the bosses 123 to be eliminated.

Figure 12:
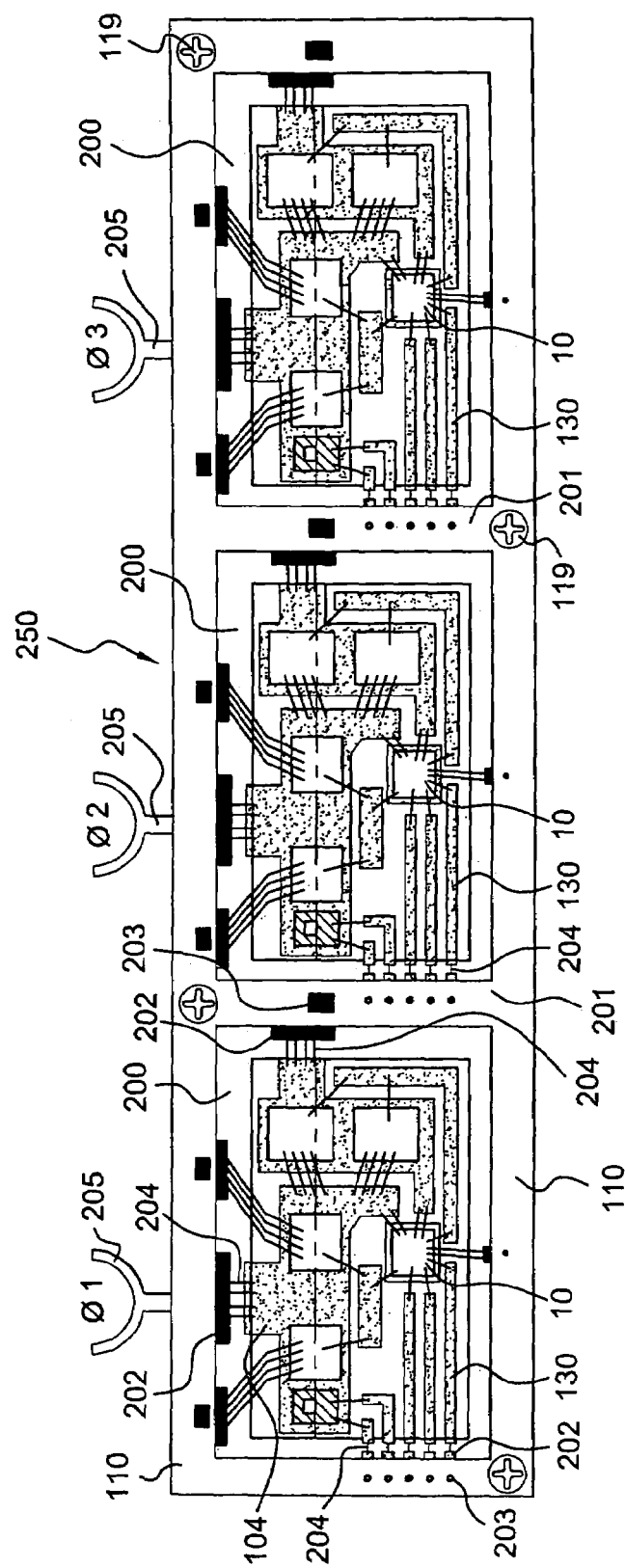
FIG. 12 shows another embodiment of the invention.

FIG. 12 illustrates one embodiment of a power module 250 for an alternator-starter, in which all of the power electronics of the three bridge arms of the control and rectifying circuit of the alternator-starter are integrated. Thus, reference 200 represents one power sub-module. This sub-module corresponds to the power electronics of a bridge arm dedicated to a phase output of the stator winding of the electrical machine. The lead frame of each of these sub-modules corresponds for example to that which is described above with reference to FIG. 6.

This embodiment has the advantage that it is inexpensive, being firstly economical as to the number of components to be located on the cooling device, and secondly, in terms of manufacturing rejects.

Preferably each of the sub-modules is separated by a partition 201. This partition 201, and the peripheral housing 110, are preferably made in the same in situ moulding operation. Preferably, the said partitions and the said housing enclose connecting pads 202 and 203. As can be seen in FIGS. 7 and 12, the pads 203 are oriented upwards with respect to the module and are divided into ground pads 203a, a pad 203b at B+ or Ua potential, corresponding to the on-board network voltage, and pads 203c for low power signals. The pads 202 are oriented towards the metallic power tracks 104 and control tracks 130. The pads 202 are connected to the above mentioned metallic tracks through wire connections of the wire bonding type. In order to connect the metallic power tracks to the corresponding pads 202, it is arranged that a plurality of wire connections are placed in parallel in order to carry the current without excessive heating.

The power pads 205 are connected directly to the phase output wires of the stator winding. Each pad 205 is subjected to a high degree of vibration when the rotary electric machine is operating. The wire connections 204 which connect the pad 205 via the corresponding pad 202 constitute a mechanical and thermal decoupling with the power sub-module, which helps to increase the reliability of the power module.

The pads 202 are open upwards so that they can be accessible at the level of the pads 203. Preferably, the pads 202 and 203 are made directly from the metallic tracks constituting the lead frame of the electronic module. Since these metallic tracks are very thick, the pads 204 will be satisfactorily rigid, which facilitates their placing, with respect to an external connection, for example by means of a cover 511 which includes metallic tracks.

Such a module can be fixed directly on an external dissipater 13.

In a first mode of assembly, it is arranged that the housing 110 and the partitions 201 is fixed on the external dissipater, for example by screw fastening. In the three zones which are dedicated to each of the sub-modules 200, a thermal and non-conducting interface is deposited on the external dissipater. Preferably, this interface 108 consists of an adhesive material containing pieces (small tablets) of glass, with these pieces of glass acting as spacers to guarantee a constant thickness between the top face of the dissipater and the power sub-modules. The support, consisting of the lead frame and the thermoplastic resin corresponding to each of the said sub-modules, is then placed on this adhesive layer. Any other thermal and electrically insulating interface, such as TVI or double sided adhesive tape, may of course also be suitable. In one embodiment, the said support corresponds to the one described with reference to FIG. 8, except that it does not include the housing 110 formed by in situ moulding. In this embodiment, the metallic power tracks 104 are in direct contact with the cooling device through the thermal interface, which helps good evacuation of heat to be obtained because of the small number of thermal interfaces to be passed through. In another version it can also be envisaged that a sub-assembly such as that described with reference to FIG. 7 or 8 can be adhesively attached.

Preferably, each of the said sub-modules is tested before being assembled on the external cooling device.

When the sub-modules are secured on the external cooling device, the wire connections 204 are made between the metallic tracks 104, 130 and the interconnecting pads 202.

At this stage of the process of assembling the power module, it is preferably that each of the sub-modules be coated with a gel 120 for guaranteeing that the chips and connections shall be sealed against humidity and pollution from outside.

A cover plate 105 is finally applied against the upper part of the housing 110. In line with the pads 203, the cover plate includes apertures so that these pads 203 extend through the cover plate to the ends of connections with power signals (phase outputs, or the on-board network at +Ua potential), or with control signals from the management unit 2.

Figure 23:
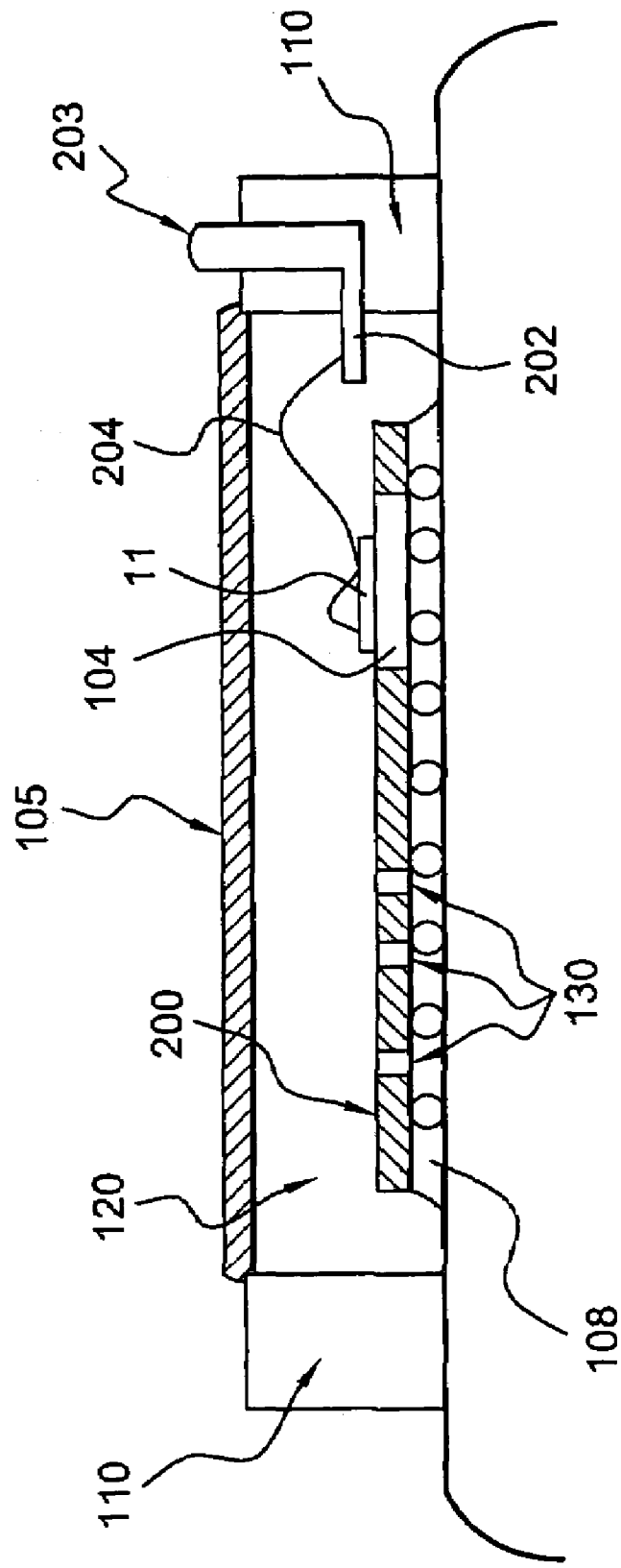
FIG. 23 is a view in cross section taken from FIG. 12.

Such an arrangement, corresponding to FIG. 12, can be seen in cross section in FIG. 23.

The power module 250 shown in FIG. 12 is rectangular in form. This module can of course be in the form of a semi-circular arc, so as to adapt it for example to the rear of a rotary electrical machine. It is possible to make this circular form with the technique of manufacture using the power lead frame described earlier herein.

As can be seen in FIG. 12, the power module 250 enables an insulated ground or earth to be obtained which is accessible through the pads 203a situated in the housing 110. The advantage of this insulated earth is evident, in particular, during switching of high currents which disturb the earths of other items of electrical equipment. For each bridge arm it is possible to have one or more ground pads 203a. Preferably, as for the pad 203b at B+ potential, a single ground pad 203a is used so as to balance the currents satisfactorily. In that case, the two ground pads 202a will be connected in the in situ moulding of the housing in order to make the connection as near as possible to the transistors, and a single ground pad 203a will have its output towards the outside.

This preferred assembly mode, in which previously tested modules (bridge arms) are fixed, has the advantage that it is very inexpensive in terms of low reject counts during production, as compared with a method in which it would be necessary to braze, in a single pass, all of the chips that constitute the assembly of three bridge arms.

In the case where the dissipater is electrically insulated from the rear bearing plate of the machine, the dissipater constitutes an insulated ground which is connected to the ground of the battery directly or through the chassis of the vehicle. In this configuration, and in the second embodiment which consists in including the electronics in a single power module, as can be seen in FIG. 12, the ground pads 202a and 203a are omitted and are replaced by ground connections which are similar to those described with reference to FIGS. 9 to 11, and in which the base 109 will be replaced by the top face of the dissipater 113.

Figure 13:
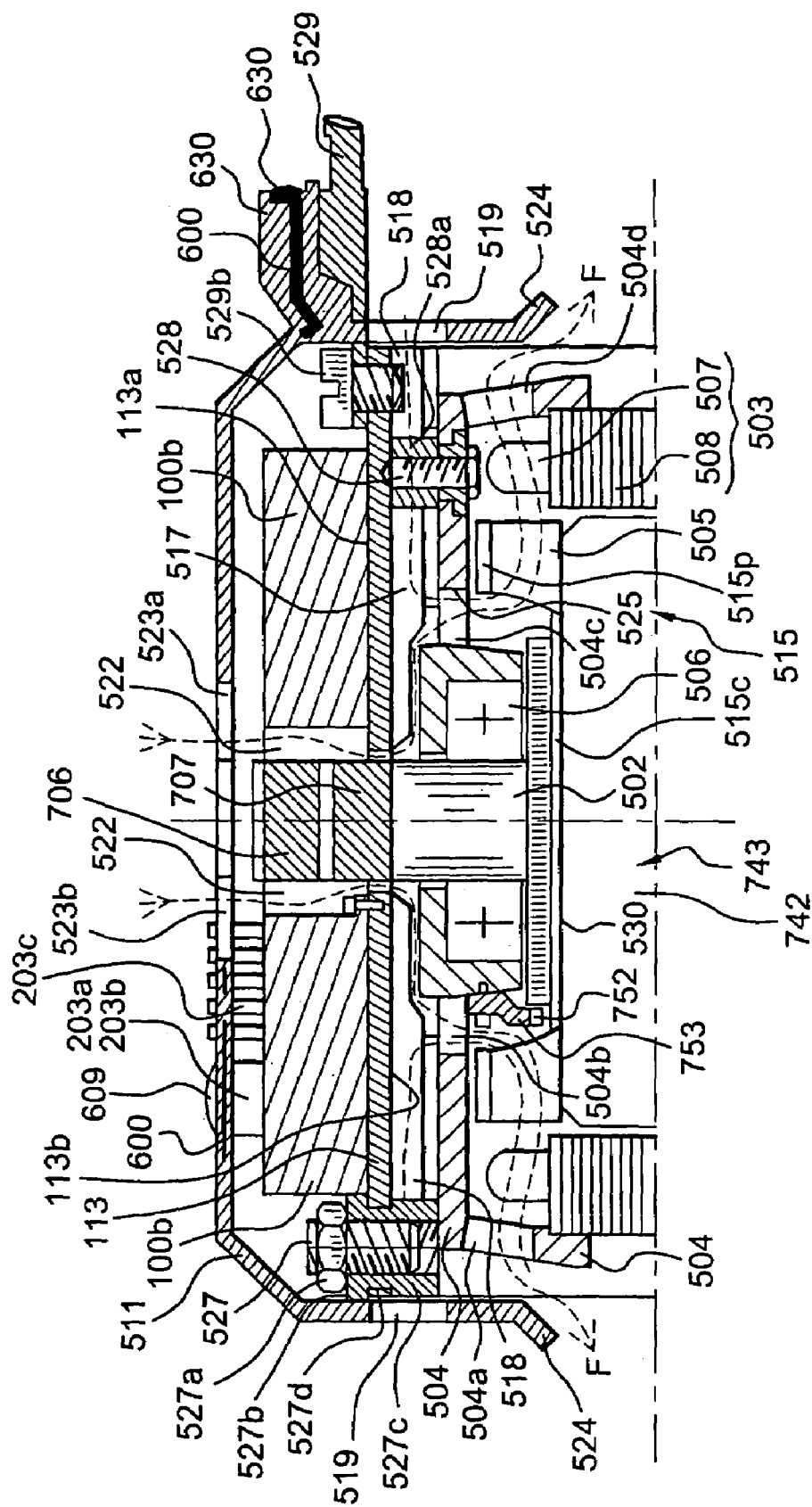
FIG. 13 is a view in cross section of a rear bearing plate including the electronic power modules according to the invention.

FIG. 13 shows a side view, in cross section, of the rear of an alternator-starter in which the electronics are integrated, having an arrangement of control and rectifying electronics according to the invention. As in all known alternator-starter machines, the machine shown in FIG. 13 has a rotor 743 fixed on a rotating shaft 502. The rotor 743 is surrounded by a stator 503 which has an armature winding 507. The stator 503 is supported by the rear bearing plate 504 and the front bearing plate (not shown), which retain the rotating shaft 502 through rolling bearings 506.

As explained earlier herein, the alternator-starter includes a rectifier bridge with MOS power transistors, associated with control units for these power transistors. The rectifier bridge and the control units together constitute the electronic power apparatus of the alternator-starter. This electronic power apparatus is mounted on the top face of a heat dissipating bridge 113, in one or more power modules 100b of the kind described earlier herein.

Preferably, the module 100a containing the management unit 2 is also mounted on the top face of the dissipater, with a view to obtaining good cooling. The management unit 2 preferably comprises a control circuit for controlling, firstly starting and restarting in the starter mode, and secondly voltage regulation in the alternator mode. This unit is also able to control the excitation stage of the rotor winding, which also requires good cooling.

In accordance with the invention, in order to obtain good cooling of the power modules 100b formed in one or more modules, the face of this heat dissipating bridge 113 which is oriented axially towards the rear bearing plate of the electrical machine defines a wall of a longitudinal or radial passage 517 for flow of a coolant fluid in the machine. The other wall of this passage 517 is then defined by the top face of the rear bearing plate 504. The lower face of the dissipater 113 includes fins 518 which define ventilating ducts 517.

A protective cover 511 has radial apertures 519 which are preferably situated facing the flow passage 517. In this way the coolant fluid, and in particular air, is introduced into the rear of the machine through these apertures 519, and then flows in the passage 517, under the dissipater bridge 113, thereby cooling the electronic power module 100b and the module 100a. A fan 515, which carries a number of blades 505 and is fixed on the rotating shaft 502 or on the rotor 743, aspirates air into the passage 517.

Figure 14:
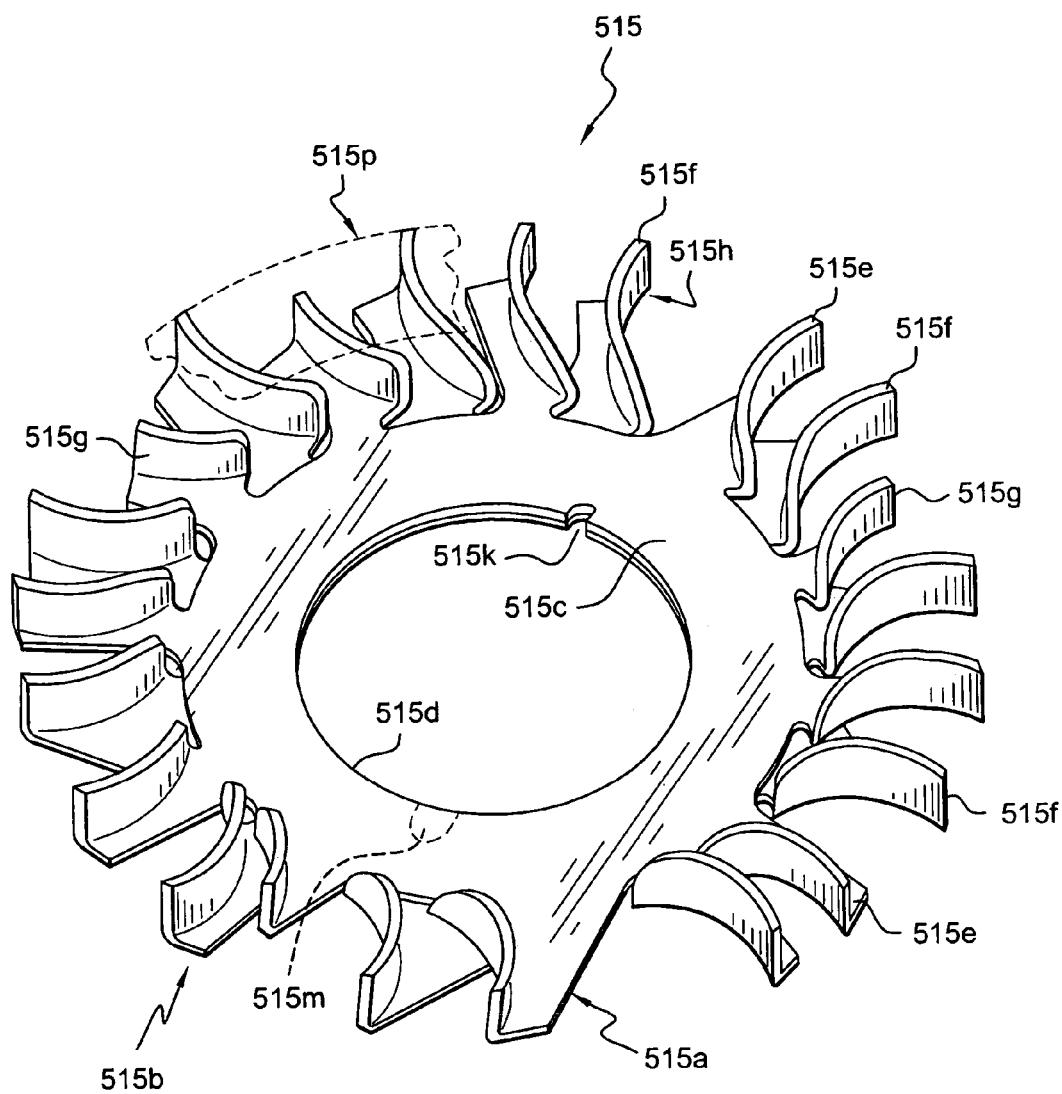
FIG. 14 shows one example of a fan used in FIG. 13.

For more effective cooling, the fan 515 may, and preferably does, consist of a double fan of superimposed form, in which at least one blade of a first fan is positioned between at least two blades of a second fan, as can be seen in FIG. 14. Thus, as shown in FIG. 14, the fan 515 comprises, in accordance with the invention, at least two fans 515a and 515b, which will be referred to from here on as the first fan and the second fan respectively. The second fan 515b is arranged to be fixed, for example in a known manner by spot welding or riveting, on the appropriate axial end 530 (i.e. the front face) of the pole wheel 742 of the rotor 743 in FIG. 13.

In this example, the fans 515a and 515b are made of metal, and can be made inexpensively from sheet steel. Each fan includes a respective radial plate portion 515c, which is substantially flat and circular, and which is provided with a circular central aperture 515d for passage of the rotor shaft 502 through it, together with a set of fan blades which project axially with respect to the plate portion 515c and which define between them ventilating ducts which are outwardly divergent in this embodiment.

The first fan 515a has a first set of blades 515e, referred to as primary blades, while the second fan 515b has a second set of blades 515f referred to as secondary blades.

Thus it is preferably between at least two consecutive blades of one of the fans that at least one blade of the other fan is located.

The primary blades 515e are, in one embodiment, radially shorter than the secondary blades 515f.

The blades 515e and 515f are substantially of the same radial length, the same shape and the same axial dimension, so that these blades are generally identical with the exception of two primary blades 515g, which are radially shorter than the other blades 515e.

The blades 515e, 515f and 515g are located at the outer periphery of the relevant central plate portion 515c.

Each of the primary blades 515e and 515g is disposed, in this example, between two secondary blades 515f.

This arrangement enables the power of the fan to be increased, and reduces the danger that the stream of cooling air will become detached from the blades. In this connection, if the air does become detached from the secondary blades 515f, the primary blades 515e and 515g will cause the air to become re-attached on the secondary blades 515f. Thus, each primary blade 515e and 515g is disposed, that is to say it is located, in the ventilating duct 515h which is defined between the two adjacent secondary blades 515f, and which is flared outwards when considered going from the inner periphery to the outer periphery of the blades. In this embodiment, at least one primary blade is therefore interposed between two consecutive secondary blades.

The primary blades 515e and 515g and the secondary blades 515f in this example are formed by press-forming and bending from their corresponding metallic flat plate 515c, and are preferably curved.

Thus, the divergent ducts are delimited partly by the outer periphery of one of the radial plate portions and by the blades.

The primary and secondary blades are radially long, and therefore give very good ventilation performance. Preferably, the blades 515e, 515f, and 515g have a radial length which is greater than their axial height.

In another version, the blades are flat and oriented radially, the fan being a centrifugal one. In a further version, the blades are inclined with respect to an axial and/or radial direction. In yet another version, the blades have an axial height greater than their radial length.

The plate portion 515c in this example has cut-out inclined portions at its outer periphery, which are preferably formed inexpensively in the press and which, after being bent out of the plane of the plate portion 515c, become the blades, which are curved in this example. More precisely, the blades have a radial cross section in the form of a circular arc.

The purpose of the primary blades 515e is to reduce the noise of the electrical machine while increasing the coolant fluid flow rate and output. Their location is done in such e way that the primary blade compresses the coolant fluid in order that the latter will be in contact with the secondary blades 515f. Reflux of the air, and turbulence, are thus prevented, and the air flow is more laminar and takes place with little friction and little noise. This arrangement enables the front fan (not shown), carried by the front pole wheel of the rotor, to be omitted if need be, so that the alternator, in another version, only has one fan.

It could of course also be possible to envisage various combinations of arrangements of the secondary blades 515f with the primary blades 515e and 515g.

Thus, it is possible to arrange several primary blades between the secondary blades. The number of primary blades arranged between the secondary blades, in the same ventilating device 515, may be constant or variable. In the present case one secondary blade is arranged between two adjacent secondary blades, that is to say they are consecutive.

It is also possible to envisage that there may be a plurality of consecutive secondary blades 515$f$ which do not have any primary blades between them.

The distribution of the primary and secondary blades is determined as a function of the electrical machine which is to be cooled, in order to obtain the best possible cooling effect with the least possible aerodynamic noise.

The primary blades 515$e$ may be spaced apart circumferentially at regular intervals, or, as in the case shown in FIG. 14, at irregular intervals. The irregular arrangement is obtained, in another version, by having some blades of different lengths from the others, such as the blades 515$g$ in FIG. 14.

The irregular arrangement enables noise in operation to be reduced even more in the fans. The same is true for the secondary blades 515$f$, which may be spaced apart circumferentially at irregular intervals as shown in FIG. 13. Thus, a set or irregular blades is obtained which is divided into two parts, one part for each fan.

In another version, a thermal insulating means, such as a thermally insulating coating, is interposed between the two radial plates 515$c$ of the first and second fans, and in this case, the first fan 515$a$ may be of plastics material reinforced with fib res. The blades 515$e$, 515$f$, and 515$g$ extend axially in the same direction and at right angles to the plane of the plate portion 515$c$.

In yet another version, the blades may be inclined and curved with respect to the plane of the associated plate portion, as is described in the document FR-A-2 602 925.

An angular indexing means is interposed between the two plate portions 515$c$ for good angular position, and therefore good orientation, of the primary blades with respect to the secondary blades. For this purpose, each plate portion 515$c$ has at its inner periphery a notch 515$k$. The notches 515$k$ in this example are identical. It is then sufficient to superimpose the notches, for example with the aid of a rod, so as to obtain the correct angular position. The fans are then fixed together, for example by welding or riveting, so as to form an assembly which can be handled and transported.

Preferably, the first plate portion has at least one opening such as a hole or a notch, indicated in broken lines at 515$m$, enabling the second plate portion to be fixed, for example by welding or riveting, on the rotor of the machine. Preferably, several holes or notches are provided.

In another version, each plate portion is fixed on the rotor by welding, for example.

It will be appreciated that the blades 515$e$, 515$f$ and 515$g$ are all at the same axial height in this example, that is to say the free edges of the blades are in the same transverse plane. More precisely, the blades 515$e$ and 515$g$ have an axial height which is smaller than that of the blades 515$f$, the difference in width being equal to the thickness of the first radial plate portion 515$c$.

In another version, the blades 515$e$ and 515$f$ have different axial heights, with the blades 515$f$ extending for example in axial projection with respect to the blades 515$e$ and 515$g$. The result of this is that the free edges of the blades are not all in the same plane.

Figure 16:
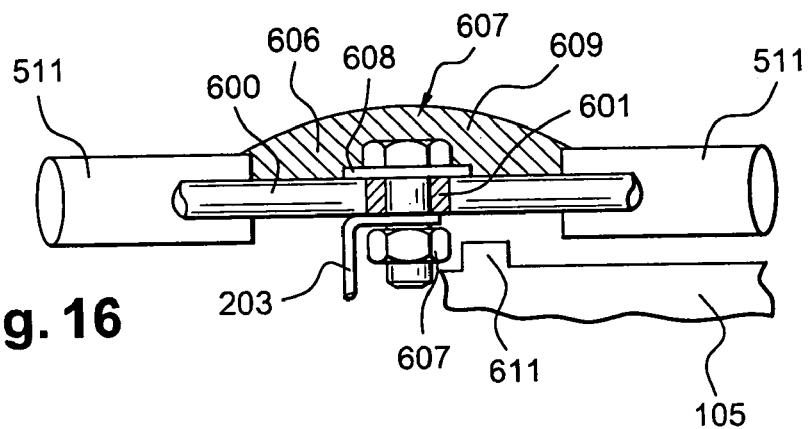

In all cases, it is possible to fix a cover piece 515$p$ on the free edge of the blades 515$e$, 515$f$ and 515$g$, or on the free edges which are furthest away from the plate portion 515$c$ as in FIG. 16 of the document FR-A-2 811 156, and as can be seen partially, in broken lines, in FIG. 14 of the present Application.

Figure 15:
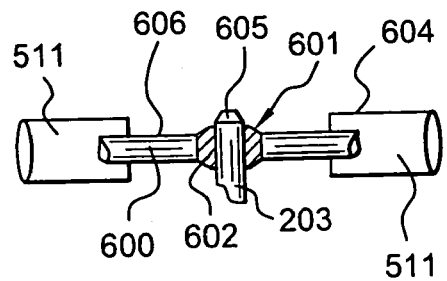
FIGS. 15, 16, 17 and 17a show various ways of connecting the outputs of the electronic modules arranged at the level of the end cap.

In yet another version, at least one blade on each of the fans is provided with an overhanging fin which is either inclined or at right angles to the plane of the radial plate portion of the fan concerned, as described and shown in FIGS. 11 to 13 of the document FR-A-2 811 156. In general terms, the present invention enables the same configurations to be obtained with two sets of blades of different sizes from those in the document FR-A-2 811 156 mentioned above, and this is achieved in a simple and inexpensive way. For example, at least one blade, and preferably at least some of the blades, in at least one of the fans, may be of a wavy form, or have a decreasing axial height, or be flat and inclined with respect to a radial direction, as indicated in FIGS. 6, 15 and 2 respectively of the said document.

Thanks to this ventilating device, the fan 515, the energy losses and noise are reduced, while the output and the air flow rate are increased and stable flow of the coolant fluid is obtained, thereby giving effective cooling of the power and control modules 100$a$ and 100$b$. In this way, a ventilating device is obtained which has complex configurations of blades which gives the latter an increased cooling power, with a relatively low selling cost, while at the same time having good mechanical strength.

For more details, reference should be made to patent application No. FR 03 02425 filed on 27 Feb. 2003.

Made in this way, the dissipater bridge 113 constitutes a mezzanine above the rear bearing plate 504.

In conformity with the invention, the dissipater bridge 113 includes, on its lower face, cooling fins 518. These cooling fins are disposed in the passage 517 and ensure flow of the coolant fluid along a chosen path, that is to say in such a way that the fluid penetrates very close to the rotatable shaft so as to flow in the best possible way over the lower face of the dissipater bridge. Thus, the lower face of the dissipater bridge is cooled to advantage over the whole radial distance situated between the outer periphery of the dissipater bridge and its inner periphery close to the shaft. The adjacent fins define radial channels for guiding the coolant fluid in the passage 517. Thus, these channels have a lower face defined by the rear bearing plate, the two sides facing the two adjacent fins and the base of the U of the dissipater bridge formed between two adjacent fins.

Preferably, the dissipater 113, including the fins 518 on its lower face 113$b$ and, on its upper face 113$a$, the control and power module or modules 100$a$, 100$b$, is monobloc. In another version the dissipater 113 carrying the power modules 100$b$ is assembled on a device with fins so as to constitute a dissipater bridge in two parts.

Figure 20:
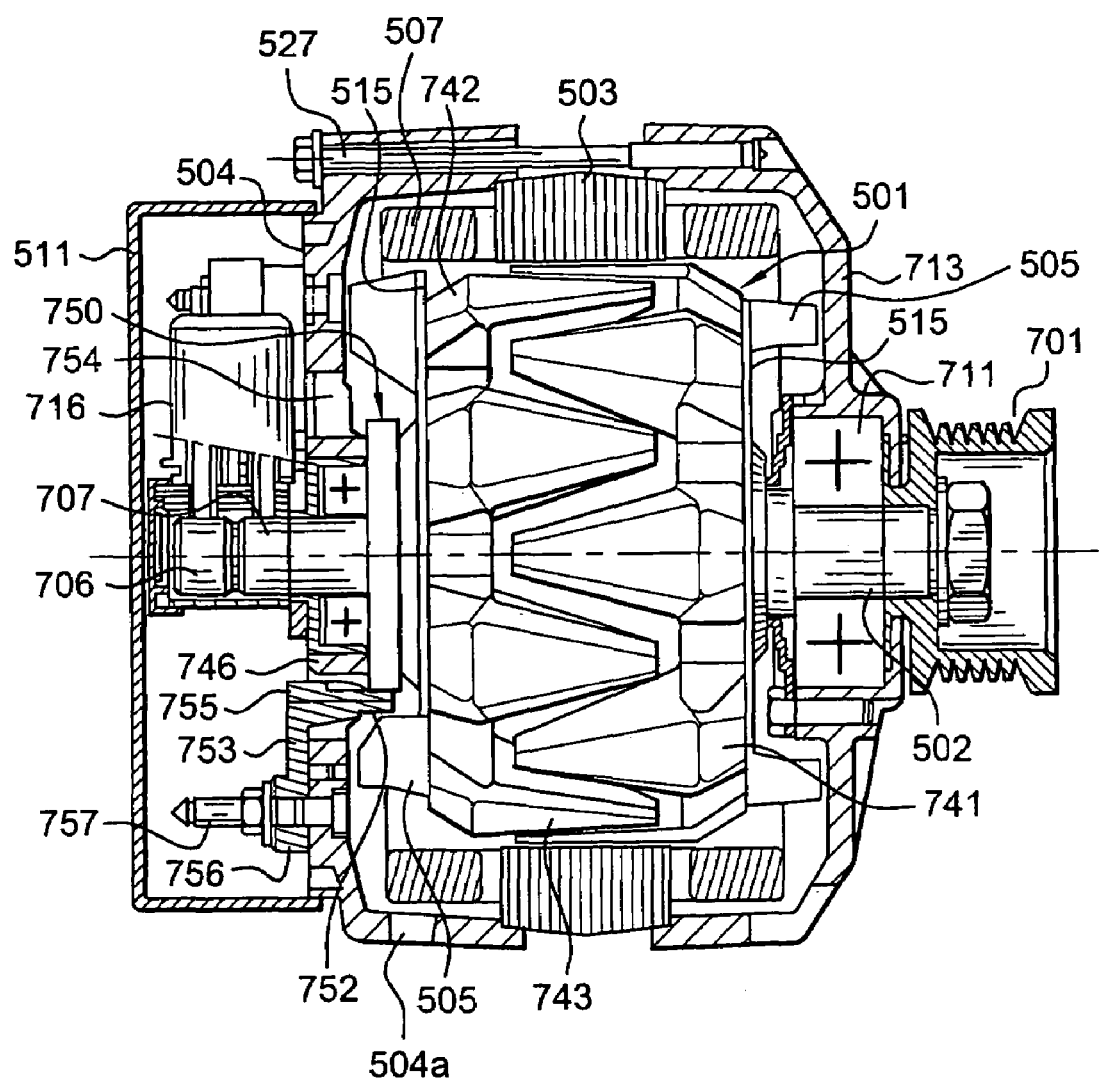
FIG. 20 shows an alternator-starter of the prior art, and has been described above.

The said fluid is then evacuated through ports 504$a$ to 504$d$ formed in the rear bearing plate 504. These ports 504$a$ to 504$d$ are preferably identical to those formed in an alternator bearing plate, like that shown in FIG. 20. The fins 518 are preferably disposed radially in the direction of flow of the fluid, being concentrated towards the central ports 504$b$ and 504$c$ of the rear bearing plate 504.

Thus, the air (or any other coolant fluid) is aspirated laterally into the alternator-starter, and flows towards the central ports 504$b$ and 504$c$ of the bearing plate 504, while flowing over the dissipater elements, that is to say the fins 518, over their whole length before being evacuated through the lateral ports 504$a$ and 504$d$ of the bearing plate 504.

Thus, the electronic power apparatus 100b is cooled by conduction and convection after the dissipater 113 has been cooled via the fins 518.

In addition, because the dissipater bridge 113 and the power modules 100b are not held flat against the rotatable shaft, there exists between the rotating shaft 502 and the dissipater bridge 113 a space 522 through which the air is also able to flow, and this is of advantage. This space 522 constitutes an axial duct for flow of the fluid. In one embodiment of the invention, ports 523a and 523b are formed in the protective cover 511. Air is then aspirated into the alternator-starter through these ports 523a and 523b, after which it flows through the space 522 along the rotating shaft 502 and rejoins the flow passage 517 below the dissipater bridge 113, and this helps to improve the cooling of the dissipater 113. In this way, the electronic power apparatus is cooled, laterally on the one hand via the passage 517, and axially on the other hand via the space 522. This additional axial air flow passing through the space 522 also enables much better cooling of the internal parts of the alternator to be obtained, such as the brush holder cage or the chignon of the armature windings, by virtue of an increase in the general air flow within the machine.

The flow path of the coolant fluid to the rear of the alternator-starter is indicated by arrows F and broken lines in FIG. 13.

In one preferred embodiment of the invention, deflectors 524 are placed downstream of the ports 504a and 504d formed in the rear bearing plate 504. These deflectors 524 enable the inward flow of fluid to be spaced away from the outward flow of fluid, so that the fluid leaving the machine is not reintroduced immediately into the passage 17. Major recirculation of the hot fluid from the interior of the machine is thus avoided.

The said deflectors 524 are able to be fixed on the bearing plate 504 close to the lateral ports 504a and 504d of the bearing plate. They can also be formed in the protective cover 511, for example by lifting the ends of the protective cover as shown in FIG. 13.

In the embodiment of the invention shown in FIG. 13, the protective cover 511 envelops all of the rear part of the alternator-starter, that is to say it envelops the electronic power apparatus 100b, 100a mounted on the dissipater bridge 113, and the whole of the rear bearing plate 504. In this case, the protective cover 511 may include ports which are situated downstream of the lateral ports of the rear bearing plate, and which are adapted to allow the fluid to be evacuated out of the machine. It may also include deflectors 524 in addition to these ports, or in place of them. The deflectors may be formed in the cover itself.

The protective cover 511 may also envelop the electronic power apparatus mounted on the dissipater bridge and the upper part of the bearing plate 504, that is to say it does not envelop the lateral sides of the bearing plate having the ports 504a and 504d. In this case, the deflectors may be fixed on the bearing plate 504, or they may be formed by bending the end of the cover outwards.

As is shown in FIG. 13, the fan 515 carries at the axial end of at least a part of the said blades 505 a cover piece 515p. This cover piece forces the air stream F to pass to the level of the blades 505 of the fan, which thus helps to give improved cooling of the chignon 507 of the stator winding and also the cooling of the electronics carried by the dissipater.

Preferably, the outer edge 525 of each port 504b and 504d formed in the rear bearing plate 504 is substantially in line with the inner edge of the blades 505, so as to cause the whole of the coolant stream F to pass between the blades 504 of the fan. Thus, only a residual flow is able to pass between the summit of the cover piece 515p and the lower axial face of the rear bearing plate 504.

Preferably, the ports 504b and 504d are close to the housing of the rolling bearing 506, so that it is able to be efficiently cooled, and this is especially so where the fan consists of two fans superimposed on each other as described above.

In a first embodiment, and as can be seen in FIG. 13, the dissipater 113 is electrically insulated from the rear bearing plate 504. Thus, the dissipater 113 constitutes an insulated ground or earth, in particular for the electronic power apparatus contained in the electronic module or modules 100b of the management unit 2. The electrical insulation of the dissipater from the rear bearing plate helps to obtain improved performance in terms of electromagnetic and thermal compatibility.

In a first modified embodiment, the dissipater bridge 113 is fixed on the rear bearing plate 504 by means of assembly studs 527 which are electrically insulated and which are preferably non-conductors of heat, thereby constituting a thermal barrier against heat coming from the stator.

Preferably, the studs 527 are the same as those used for conventionally fixing the bearing plate 504 with the magnetic circuit 508 of the stator 503. An electrically insulating washer 527b is interposed between the fastening nut 527a and the top face 113a of the dissipater 113. A spacer 527c, having a shoulder 527d, is interposed between the lower face 113b of the dissipater and the axially outer face of the rear bearing plate 504.

In another modified version, the dissipater 113 is fixed with respect to the rear bearing plate 504 in an electrically insulated manner, by means of a screw 528, the head of which is oriented on the side of the lower axial face of the bearing plate 504. In this embodiment, an electrically non-conductive spacer 528a is placed between the lower face 113b of the dissipater 113 and the upper axial face of the rear bearing 504. The screw 528 is engaged against a shouldered, electrically insulating insert placed within the axial thickness of the rear bearing plate 504.

It will be perfectly clear that other fastening means for securing the dissipater on the bearing plate may be envisaged.

The spacers 527c or 528a can of course be fixed with respect to the dissipater bridge 113 or indeed the bearing plate 504, so as to constitute fastening pads. In that case, electrically and thermally insulating means, such as insulating washers, must be located at the ends of these fastening pads.

The dissipater carrying the electronic command and power apparatus is thus located spaced away from the outer axial face of the rear bearing of the rotary electrical machine, so as to constitute a mezzanine which is cooled by air which is introduced mainly in the radial direction between this mezzanine and the upper axial face of the rear bearing plate.

In an embodiment as described above with reference to FIG. 7, the power module 100b is connected to ground, or earth, by a direct electrical contact between the base 109 and the upper face 113a of the dissipater.

An earth cable 529, electrically connected to the dissipater by a fastening means 529b such as screw fastening or welding, is preferably connected to the negative terminal of the battery of the motor vehicle, so as to constitute an insulated ground.

As described earlier herein, the pads 203, which correspond to the signal or control connections coming from the power module or modules 100b, are oriented axially towards the rear of the electrical machine for electrical connection purposes. These pads 203 preferably reach the cover 511, which is of plastics material and which contains metallic power and control tracks applied by in situ moulding. Preferably, the cover encloses all of the metallic tracks which enable all of the connections to be made, firstly between the various power modules, and secondly between the power modules 100b and the management unit 2. Thus, this arrangement has the advantage that it does not have wire connections under the cover, which gives a considerable cost advantage. In this regard, all the connections of low and high power are made in one single pass at the level of the assembly of the cover on which the metallic tracks are formed. Suppression of these wire connections under the cover enables space to be gained and therefore enables the axial length of the machine, for example, to be reduced.

FIGS. 15 and 16, and FIGS. 17 and 17a describe possible means for making electrical connection between the pads 203 and the metallic tracks which are contained in the cover 511 by in situ moulding.

As shown in FIG. 15, the pad 203 passes through an orifice 601, which is closed or half closed, and which is formed in the track 600 that is to be connected. Preferably, the end of the pad 203 leaves from the other side of the track 600 so as to be fastened by means of a weld. The reference 602 shows this weld.

Preferably, the end 605 of the pad 203 is substantially at the same axial height, preferably a mid height, as the upper axial edge of the cover 511, so as to avoid damage to the weld during handling of the electrical machine. The said metallic tracks are accessible through holes 606 which are formed in the rear cover 511.

The form of the pad 203 is adapted according to its positioning tolerance.

FIG. 16 shows a modified version of an electrical connection between a pad 203, which is preferably a power connector, and its associated metallic track, by a screw fastening means of the bolt and nut type. In a manner known per se, a split washer of the Grover 608 type is interposed between the lower face of the bolt and the outer face of the metallic track, and the pad 203 is gripped between the nut and the lower face of the metallic track. In this embodiment, a portion 611 of the cover plate 105 of the module 100b, comprising one or the three bridge arms, preferably comes into contact with the nut 607 so as to prevent it from rotating when the screw fastening operation has been done.

Figure 17:
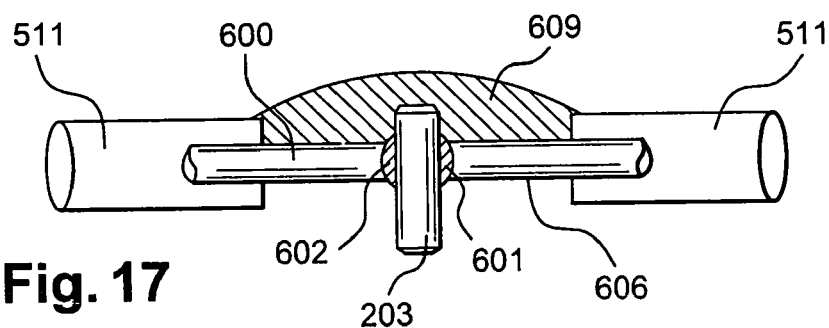

FIG. 17 shows a connection made by welding as described with reference to FIG. 15, comprising a protection of the varnish, adhesive or silicone type for avoiding chemical attack of the salt, fog or humidity type. This protection is also applicable for the fastening means by bolt and nut described with reference to FIG. 15.

Figure 17A:
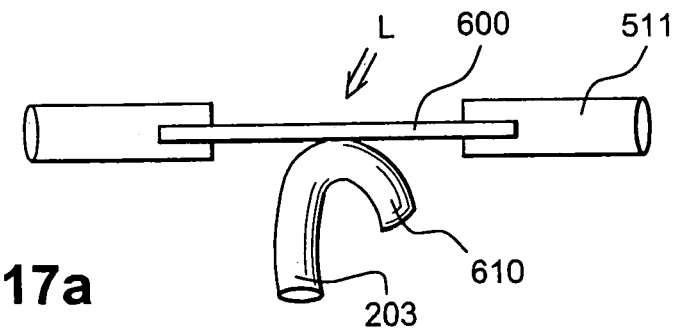

FIG. 17a shows a joint L, formed by welding of the laser type, in which the pad 203 does not pass through the metallic track. In this case, the pad 203 has a curved portion 610 which is adapted to make stress-free contact with the metallic track 600 when the cover 511 is mounted on the rear of the electrical machine. This embodiment has the advantage that the cover 511 is hermetically sealed effectively.

Figure 18:
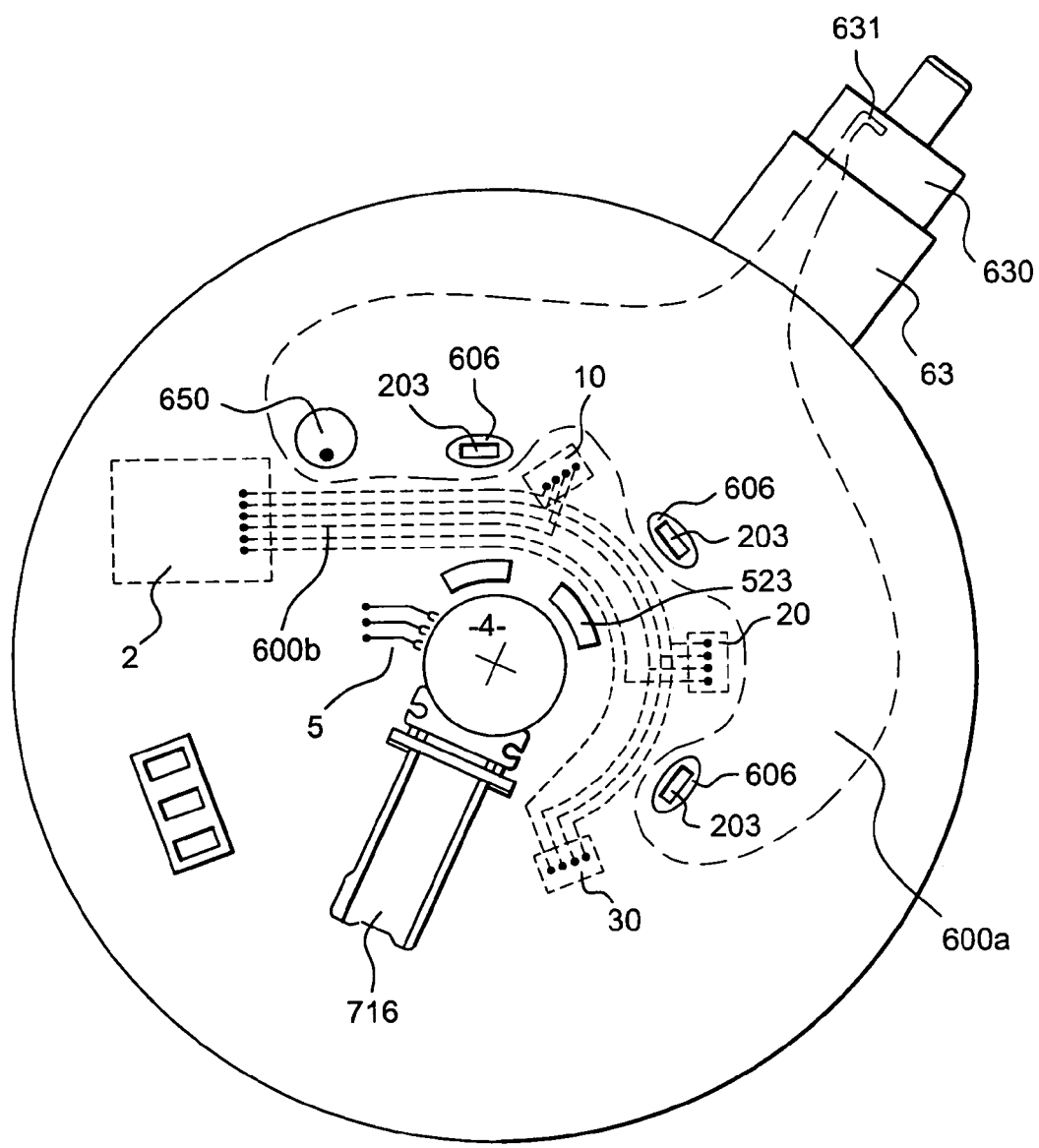
FIGS. 18 and 19 show a rear axial view of the end cap of the electrical machine.

FIG. 18 shows a rear cover according to the invention, seen from behind the rotary electrical machine. This embodiment corresponds to the case where the dissipater 113, constituting a mezzanine, is insulated electrically from the rear bearing plate 504. Thus, with advantage, the cover 511 has only one metallic track 600a of high power, which is capable of carrying currents of about 1000 amperes during starting phases. This metallic track 600a, which preferably includes the connection 650 at the potential B+ of the brush carrier, and dedicated to the positive terminal B+ connected to the electrical wiring network of the motor vehicle, can therefore be designed to occupy all the space which is necessary for it without the interference with the other connection, that is to say the earth connection 600b, that will be necessary when the mezzanine is not insulated and as is illustrated in FIG. 19.

Figure 19:
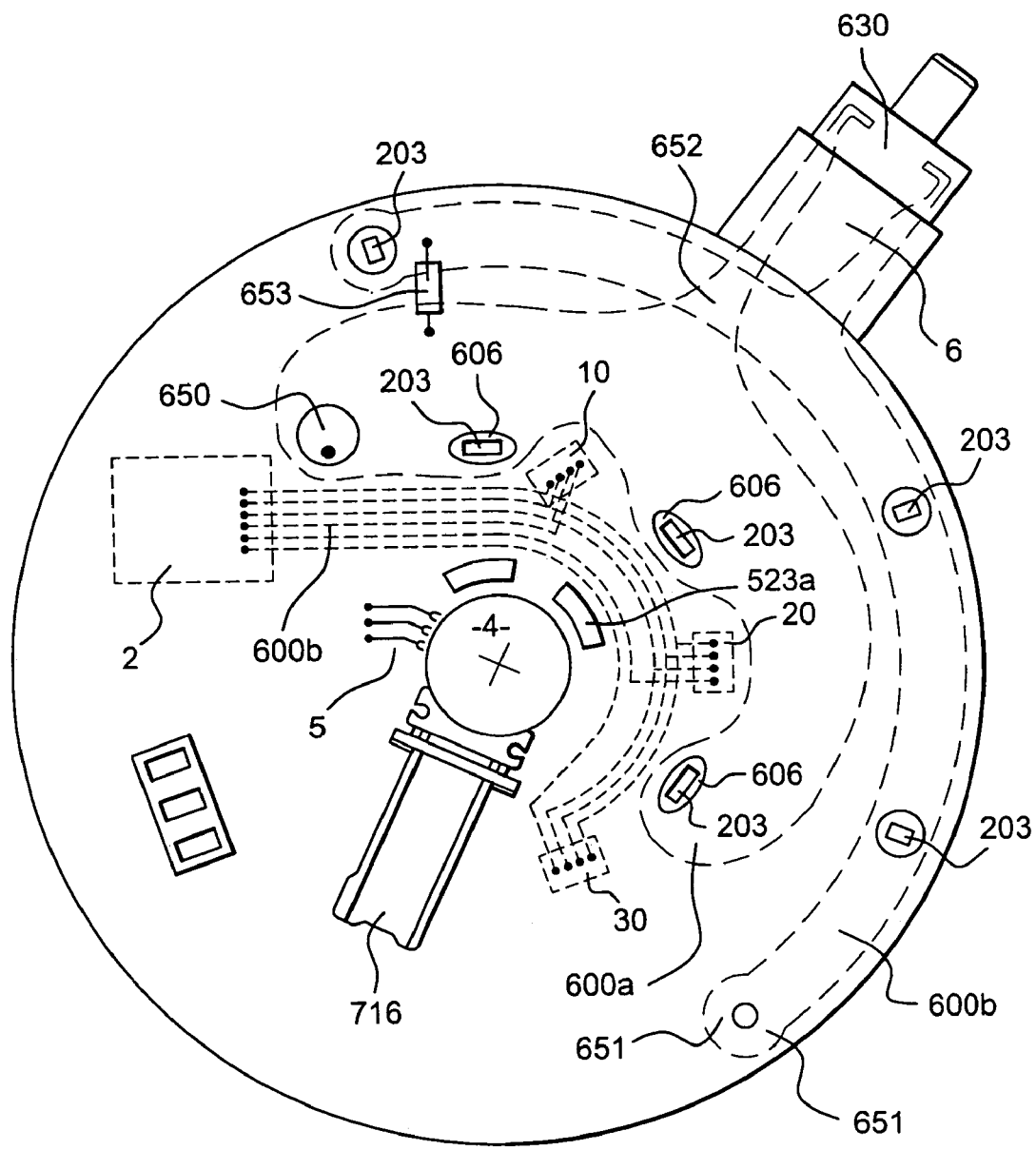

As can be seen in FIGS. 18 and 19, it is very easy to connect the drivers 10, 20 and 30, placed centrally close to the rotating shaft, with the management module 2 described earlier herein. Thus, in accordance with the invention it is possible to obtain an electrical machine of the alternator-starter type which includes on its rear bearing plate, and fixed mechanically, all of the electronic power apparatus for command and control which is necessary for its operation. It will be clear that, according to circumstances, the electronic functions may be removed into an external housing without departing from the scope of the invention. The architecture of the rear bearing plate as described above also enables very good cooling of its power module or modules to be obtained, because its structure comprises that of a mezzanine cooled by a coolant fluid introduced radially, with, preferably, complementary axial introduction as well. This cooling action is even more effective when the electronic power modules are made in accordance with FIGS. 6 to 12. The integration of the electronic power apparatus into one or more modules, preferably connected through tracks formed by in situ moulding in the cap, enables the power and/or control electronics of the machine to be fitted extremely easily, and therefore inexpensively. In addition, integration of the metallic power tracks in the cover enables the connector 630 to be easily fitted in any position on the cover, so as to adapt it to the configuration of the motor vehicle.

FIG. 19 shows a second modified embodiment of the cover 511 including the metallic tracks in accordance with the invention, for a dissipater constituting a mezzanine at the same electrical potential as the rear bearing plate 504. In this case, the power modules are electrically insulated with respect to the dissipater. In this embodiment, it is no longer necessary to insulate the spacers 527c or 528a, constituting fastening pads, electrically as described earlier herein. Thus, the electrically insulating washers or inserts, placed at the ends of the said fastening pads or between the mezzanine and the rear bearing plate, may be omitted, thereby giving the assembly consisting of the rear bearing plate and the mezzanine more mechanical rigidity.

In this embodiment, the cover incorporates, besides those described with reference to FIG. 18, the power track 600b which is connected to ground. To reach the connector 630, the two power tracks 600a and 600b straddle each other in a zone 652 of the cover which preferably has at this point an increased thickness so that the two tracks remain moulded in position at this point. At this point the in situ moulding of the tracks will be carried out in such a way as to guarantee electrical insulation. In order to effect this crossing, at least one of the two tracks will have at least one bent portion.

In this embodiment the connection 651 of the brush carrier to ground is also preferably obtained through the ground track 600b.

As can be seen in FIGS. 18 and 19, a connector 653 is also provided and is adapted to communicate with an external electronic unit, for example through a known protocol of the Can, Lan, Lin or BSP type, or through a simple wire connection.

Preferably, filter capacitors 653, as can be seen in FIG. 19, may be connected through the cover 511. These capacitors 653, which are soldered between the power tracks Ua and ground, form an integral part of the cover, for example by moulding in situ, or by clipping attachment or by adhesive bonding. In the same way, the capacitors may be located between the low power metallic tracks of the cover.

Figure 21:
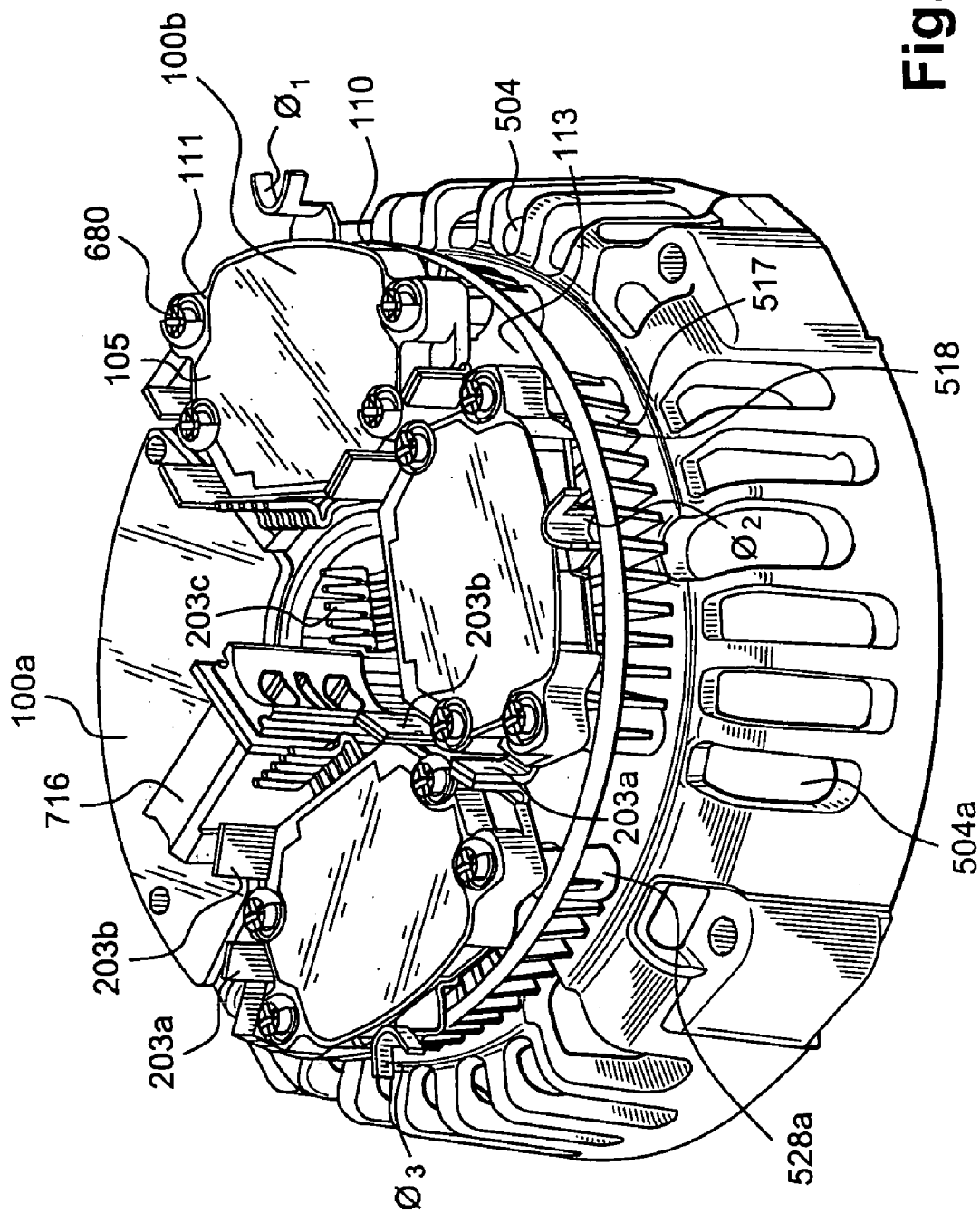
FIGS. 21 and 22 show one embodiment of the modules shown in FIGS. 7 and 12.
Figure 22:
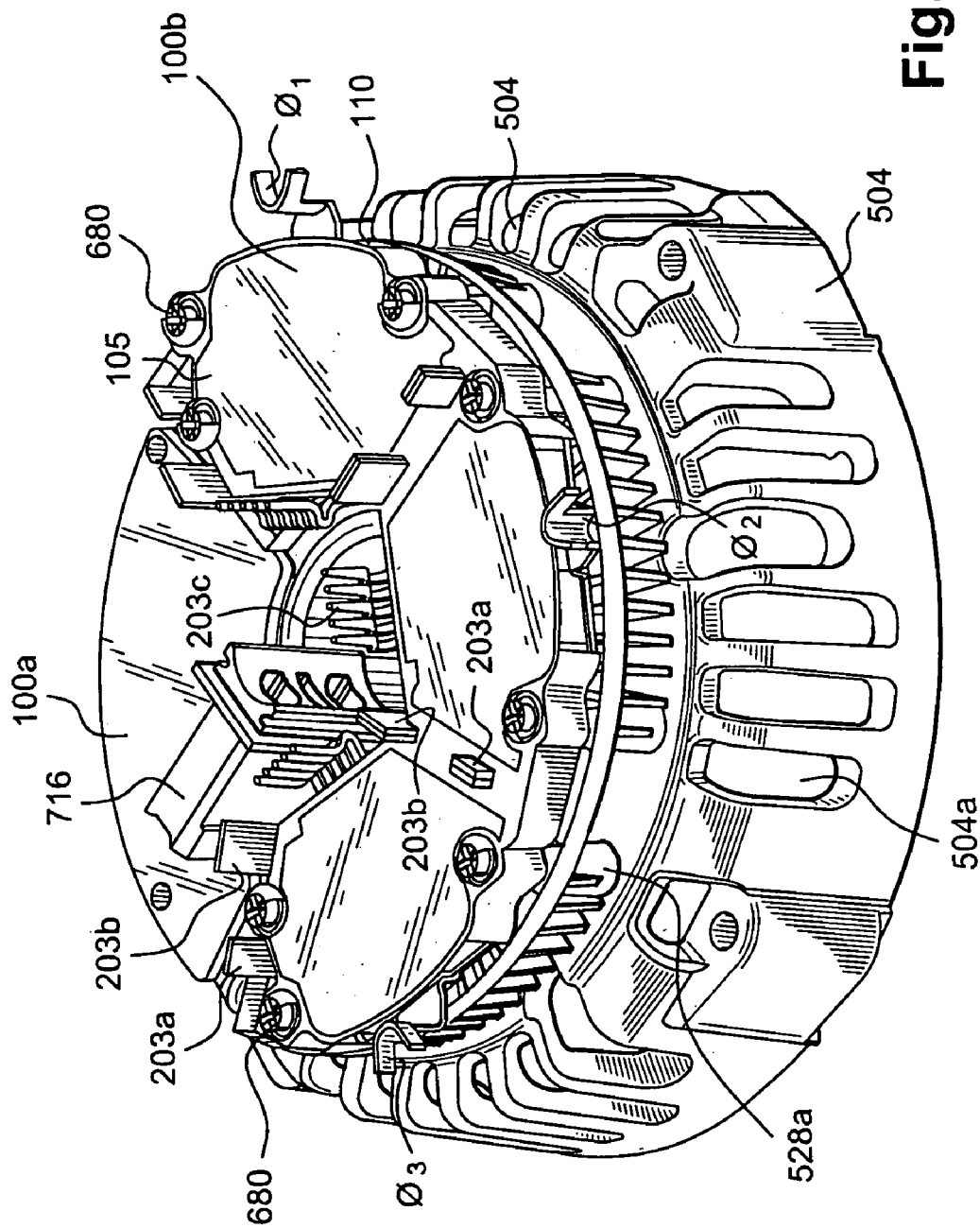

FIGS. 21 and 22 show two embodiments of an alternator rear bearing plate which incorporates its electronic command and control apparatus on a dissipater bearing plate 113 constituting a mezzanine according to the invention.

In these two Figures, the fastening pads 528a are not electrically insulated, so that the dissipater bearing plate 113 is not electrically insulated. The earths of the electronic modules 100b are therefore brought to the level of the pads 203a.

FIG. 21 corresponds to the electronic power apparatus 100b divided into three modules, each of which corresponds to one bridge arm and is of the kind described earlier herein with reference to FIG. 7, while FIG. 22 corresponds to the arrangement of the electronic power apparatus which incorporates the three bridge arms into a single module, in the manner described with reference to FIG. 13.

In these two Figures, the reference numeral 100a represents the emplacement dedicated to the module 100a of the management unit 2 which also has the connecting pads 203c.

As can be seen in FIG. 21, the power pads 203a and 203b are abutted together, so as to be connected electrically in a single pass, for example at the level of the metallic tracks of the cover 511 as described earlier herein.

Screws 680, inserted for example in the housings 111 for the power modules 100b, ensure fastening of these power modules on the dissipater 113.

The invention claimed is:

1. A control and power module (100) for a polyphase alternator-starter for a motor vehicle, connected to the phases of the alternator-starter (3) and to the on-board network (Ua), and to a ground line (GND) of the vehicle, comprising:
    a power unit (1), which includes a transistor bridge having a plurality of branches (B1–B3),
    a control unit (50),
    characterized in that the transistors in common on a branch of the bridge are governed by corresponding drivers (10, 20, 30) which are located close to these transistors and are controlled by a management circuit (2), wherein said management circuit and said drivers are part of said control unit (50).

2. A control and power module according to claim 1, characterised in that the drivers (10, 20, 30) and the power unit (1) constitute a first stage of the module, the management circuit (2) constituting a second stage of the module.

3. A control and power module according to claim 1, characterised in that it is integrated in the rear of the alternator-starter.

4. A control and power module according to claim 1, characterised in that the management circuit (2) is spaced away from the drivers.

5. A control and power module according to claim 2, characterised in that the first stage is integrated in the alternator-starter, and the second stage is located in a housing outside the alternator-starter.

6. A control and power module according to claim 1, characterised in that each branch of the transistor bridge and the driver which governs it are connected close to one of the phase outputs of the alternator-starter.

7. A control and power module according to claim 1, characterised in that it is adapted to be connected to a three-phase alternator-starter, each phase of which is connected to one of the branches (B1, B2, B3) of the power unit, and in that the three branches are identical.

8. A control and power module according to claim 1, characterised in that control signals from the management circuit (2) are common to all the drivers.

9. A control and power module according to claim 1, characterised in that each transistor is a set of transistors connected in parallel.

10. A control and power module according to claim 1, characterised in that each driver (10, 20, 30) is controlled by the same management circuit (2).

11. A control and power module according to claim 1, characterised in that each of the drivers (10, 20, 30) controls the power transistors (11, 12, 21, 22, 31, 32) of a common branch (B1, B2, B3).

12. A control and power module according to claim 11, characterised in that each branch of the bridge comprises at least two power transistors, each of which has a grid, and in that the drivers (10, 20, 30) are connected at the output to the grids of the two power transistors, (11, 12; 21, 22; 31, 32) of one common branch.

13. A control and power module according to claim 11, characterised in that the power transistors (11, 12, 21, 22, 31, 32) are located on metallic tracks (104).

14. A control and power module according to claim 13, characterised in that the metallic tracks (104) of a power sub-module (200) constitute a set of tracks spaced apart from each other.

15. A control and power module according to claim 13, characterised in that the power transistors (11a, 11b) which are in the same one of the bridge arms are placed symmetrically with respect to the phase input (ψ1, ψ2, ψ3) in order to give balanced current distribution.

16. A control and power module according to claim 13, characterised in that the low side power transistors (11a, 11b), and the high side transistors (12a, 12b) which are part of the same one of the bridge arms, are mounted essentially at right angles to each other so as to obtain balanced current distribution.

17. A control and power module according to claim 14, characterised in that the power transistors (11a, 11b) which are in the same one of the bridge arms are placed symmetrically with respect to the phase input (ψ1, ψ2, ψ3) in order to give balanced current distribution.

18. A control and power module according to claim 14, characterised in that the low side power transistors (11a, 11b), and the high side transistors (12a, 12b) which are part of the same one of the bridge arms, are mounted essentially at right angles to each other so as to obtain balanced current distribution.

* * * * *